(12) United States Patent
Aloni et al.

(10) Patent No.: US 7,098,468 B2
(45) Date of Patent: Aug. 29, 2006

(54) RASTER FRAME BEAM SYSTEM FOR ELECTRON BEAM LITHOGRAPHY

(75) Inventors: Meir Aloni, Hertslia (IL); Mula Friedman, Nes Ziona (IL); Jimmy Vishnipolsky, Petah Tikva (IL); Gilad Almogy, Rehovot (IL); Alon Litman, Nes Ziona (IL); Yonatah Lehman, Bet Gamliel (IL); Doron Meshulach, Ramat Gan (IL); Ehud Tirosh, Nes Ziona (IL)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/661,719

(22) Filed: Sep. 11, 2003

(65) Prior Publication Data

US 2005/0274911 A1    Dec. 15, 2005

Related U.S. Application Data

(63) Continuation-in-part of application No. 10/289,209, filed on Nov. 7, 2002, now Pat. No. 6,841,787.

(60) Provisional application No. 60/479,756, filed on Jun. 18, 2003, provisional application No. 60/449,236, filed on Feb. 20, 2003, provisional application No. 60/430,005, filed on Dec. 2, 2002.

(51) Int. Cl.
*G21K 5/10* (2006.01)
*H01J 37/08* (2006.01)
*A61N 5/00* (2006.01)
*G21G 5/00* (2006.01)

(52) U.S. Cl. .......................... 250/492.22; 250/492.22; 250/492.3; 430/296

(58) Field of Classification Search ........... 250/492.22, 250/492.3; 430/296
See application file for complete search history.

(56) References Cited

U.S. PATENT DOCUMENTS

| 4,419,182 A | 12/1983 | Westerberg |
| 5,635,976 A | 6/1997 | Thuren et al. |

(Continued)

FOREIGN PATENT DOCUMENTS

EP    0 660 370    6/1996

(Continued)

OTHER PUBLICATIONS

Hiroshi Yasuda, Soichiro Arai, Jun-Ichi Kai, Yoshihisa Ooae, Tomohiko Abe, Shigeru Maruyama, and Takashi Kiuchi, "Multielectron beam blanking aperture array system SYNAPSE-2000", Nov. 1, 1996, pp. 3813-3820, American Vacuum Society, New York, U.S.

(Continued)

*Primary Examiner*—John R. Lee
*Assistant Examiner*—Jennifer Yantorno
(74) *Attorney, Agent, or Firm*—Tarek N. Fahmi

(57) ABSTRACT

A method for writing a master image on a substrate includes dividing the master image into a matrix of frames, each frame including an array of pixels defining a respective frame image in a respective frame position within the master image. An electron beam is scanned in a raster pattern over the substrate, while shaping the electron beam responsively to the respective frame image of each of the frames as the electron beam is scanned over the respective frame position, so that in each frame, the electron beam simultaneously writes a multiplicity of the pixels onto the substrate.

66 Claims, 10 Drawing Sheets

U.S. PATENT DOCUMENTS

| | | | |
|---|---|---|---|
| 5,691,541 | A | 11/1997 | Ceglio et al. |
| 5,757,010 | A | 5/1998 | Langer |
| 5,969,365 | A | 10/1999 | Takemoto et al. |
| 5,973,332 | A * | 10/1999 | Muraki et al. ........... 250/492.2 |
| 6,014,200 | A * | 1/2000 | Sogard et al. ................ 355/53 |
| 6,262,429 | B1 | 7/2001 | Rishton et al. |
| 6,285,488 | B1 | 9/2001 | Sandstrom |
| 6,312,134 | B1 | 11/2001 | Jain et al. |
| 6,333,138 | B1 | 12/2001 | Higashikawa et al. |
| 6,376,847 | B1 | 4/2002 | Saito |
| 6,379,867 | B1 * | 4/2002 | Mei et al. ................... 430/296 |
| 6,399,261 | B1 | 6/2002 | Sandstrom |
| 6,424,879 | B1 | 7/2002 | Chilese et al. |
| 6,429,443 | B1 | 8/2002 | Mankos et al. |
| 6,433,347 | B1 * | 8/2002 | Suzuki ................. 250/492.22 |
| 6,448,999 | B1 | 9/2002 | Utterback et al. |
| 6,493,867 | B1 | 12/2002 | Mei et al. |
| 2002/0024714 | A1 | 2/2002 | Sandstrom et al. |
| 2002/0033449 | A1 | 3/2002 | Nakasuji et al. |
| 2002/0038823 | A1 | 4/2002 | Hamaguchi et al. |
| 2002/0038853 | A1 | 4/2002 | Hiroshi et al. |
| 2003/0122091 | A1 | 7/2003 | Almogy |

FOREIGN PATENT DOCUMENTS

| | | |
|---|---|---|
| EP | 1 253 619 | 10/2002 |
| WO | WO 02/13226 | 2/2002 |
| WO | WO 02/14952 | 2/2002 |

OTHER PUBLICATIONS

"International Search Report", International Searching Authority, PCT/US 03/34785, (Jul. 8, 2004).

* cited by examiner

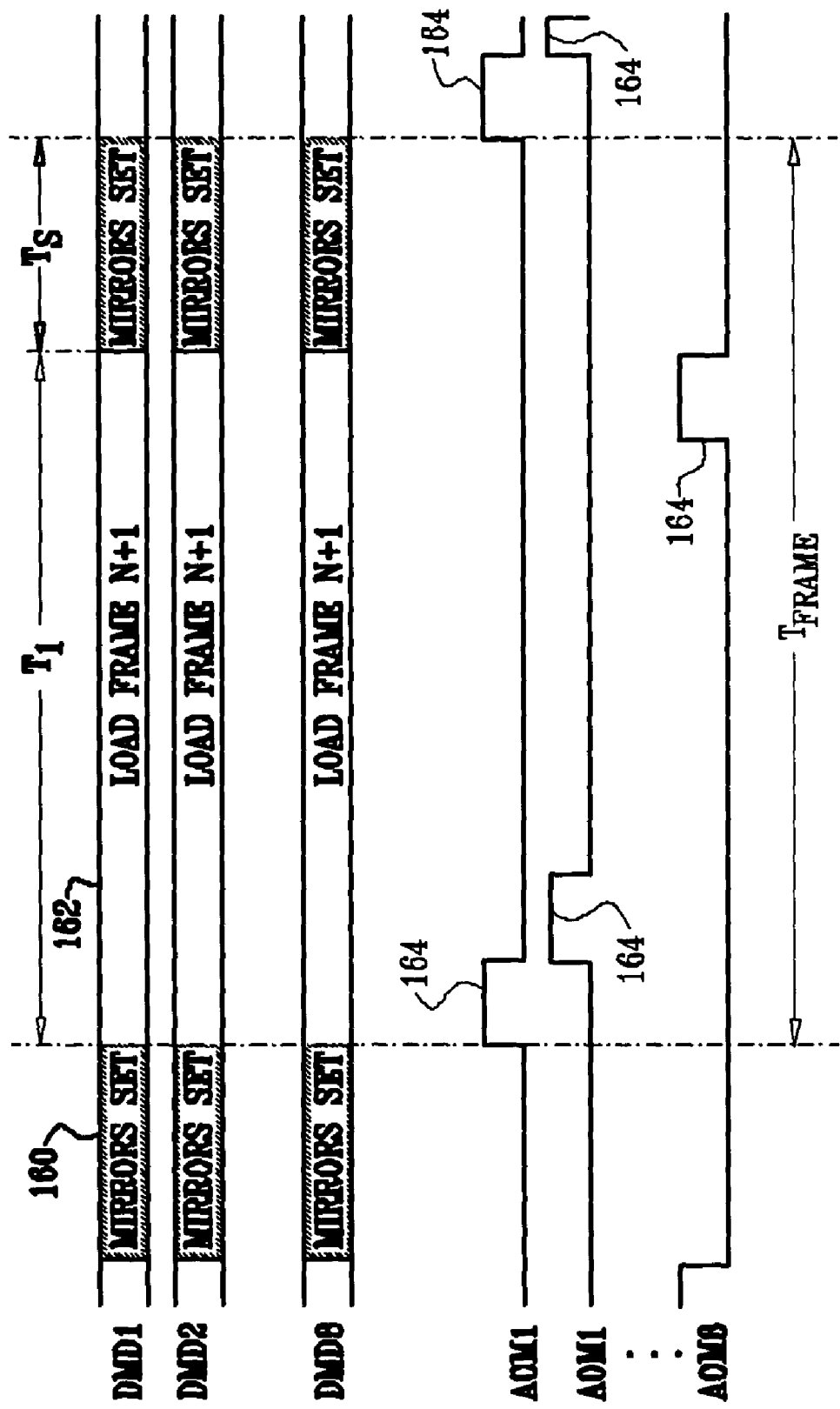

RASTER FRAME BEAM SYSTEM FOR ELECTRON BEAM LITHOGRAPHY

CROSS-REFERENCE TO RELATED APPLICATIONS

This application claims the benefit of the following U.S. provisional patent applications: Provisional Patent Application No. 60/430,005, filed Dec. 2, 2002; Provisional Patent Application No. 60/449,236, filed Feb. 20, 2003; and a Provisional Patent Application No. 60/479,756, filed Jun. 18, 2003. This application is a continuation-in-part of U.S. patent application Ser. No. 10/289,209, filed Nov. 7, 2002 now U.S. Pat. No. 6,841,787, and published as U.S. Patent Application Publication 2003/0122091. All of these related applications are assigned to the assignee of the present patent application, and their disclosures are incorporated herein by reference.

FIELD OF THE INVENTION

The present invention relates generally to methods and systems for writing a master image onto a substrate, and specifically to direct writing of lithographic patterns onto wafers, masks, reticles and other substrates used in production of microelectronic devices.

BACKGROUND OF THE INVENTION

In semiconductor device production, circuit patterns are commonly written onto semiconductor substrates by lithographic processes. In image-projection lithography, radiation is projected through a master mask or reticle onto a photoresist layer on the substrate in order to create the circuit patterns. In direct-write systems, on the other hand, the circuit pattern is written onto the substrate by directly modulating a beam of light or electrons, which is then incident on the photoresist layer. Masks and reticles may also be produced by this sort of direct-write process.

One method known in the art for direct writing of circuit patterns is to scan a focused laser beam or electron beam over the surface of the substrate in a pattern of multiple, parallel lines, known as a raster. Each line consists of a single row of pixels in the master image that is to be written on the substrate. At each pixel location, the beam intensity is controlled to give the desired pixel exposure. A direct-writing photolithography system of this sort is described, for example, in U.S. Pat. No. 5,635,976, whose disclosure is incorporated herein by reference.

Alternatively, it is possible to write an entire frame of pixels on the substrate simultaneously, using a spatial light modulator (SLM) to create the desired pattern. For example, U.S. Pat. No. 5,691,541, whose disclosure is incorporated herein by reference, describes a lithography system in which a programmable array of binary light valves or switches is programmed to replicate a portion of the circuit pattern each time an illuminating light source is flashed. The substrate is mounted on a scanning stage. The stage motion and the pattern of the programmable array are synchronized with the illumination system so that each flash accurately positions the image of the pattern on the substrate. In this manner, the entire image is built up of multiple flashes. In one embodiment, the light pattern projected by the programmable array is incident not on the substrate, but rather on an electron-emitting photocathode. The light pattern causes the photocathode to emit electrons, generating a corresponding electron image that is focused onto the substrate by electron optics. By using electrons rather than photons to create the final image, it is possible to achieve higher resolution.

Another approach to electron beam shaping is described in U.S. Pat. No. 6,014,200, whose disclosure is also incorporated herein by reference. This patent describes an electron beam lithography system that uses multi-aperture arrays to shape an electron beam. The electron beam is divided up into multiple beamlets. Deflection logic is then used to blank selected beamlets in order to create selected beam patterns. The unblanked beamlets are directed onto a surface to be exposed. A moving objective lens (MOL) may be used in scanning the beam over the surface.

Other systems for direct-light lithography based on spatial light modulators are described in U.S. Pat. No. 6,285,488, U.S. Pat. No. 6,312,134, U.S. Pat. No. 6,399,261, U.S. Pat. No. 6,493,867 and U.S. Patent Application Publication 2002/0024714, whose disclosures are incorporated herein by reference, as well as in the above-mentioned U.S. Patent Application Publication 2003/0122091. In some of these systems, the SLM is operated to project gray-scale images onto the substrate, with multiple gray levels, rather than binary images as in the system described in U.S. Pat. No. 5,691,541. For example, U.S. Patent Application Publication 2002/0024714 describes apparatus for creating a pattern on a workpiece, wherein the modulating elements of the SLM can be set by drive signals to more than two different states, thus giving intermediate exposure values of the light incident on the workpiece. U.S. Pat. No. 6,285,488 describes a method for creating a large pattern on a workpiece by stitching together partial images created by different light pulses. The partial images are made to overlap one another, and are projected with reduced light intensity in the overlap region in order to reduce the visibility of the edges between the partial images.

SUMMARY OF THE INVENTION

Embodiments of the present invention provide improved methods and systems for writing a master image onto a substrate, combining the advantages of raster scanning and frame projection. In these embodiments, the master image is divided into a matrix of frames, each comprising an array of pixels defining a respective frame image that is derived from the master image. An electron beam is scanned in a raster pattern over the substrate, so as to traverse the positions of the frames in the matrix. Electron optics focus the beam onto the substrate so that in each frame position along the scan, the beam covers the area of a single frame on the substrate.

At each frame position, the beam is shaped in accordance with the corresponding frame image at that position. In this manner, the beam writes all the pixels in each frame at the appropriate intensity levels (also referred to as pixel values), while writing multiple pixels in each frame at the same time. Typically, all the pixels in the frame that have the same pixel value are written onto the substrate substantially simultaneously, and all the pixels in the frame are written by the beam simultaneously or within a short period of time, before the beam is scanned to the next frame position in the raster. This approach has the advantages of high resolution and high accuracy in reproducing the features of the master image on the substrate, along with high throughput thanks to the raster frame scanning scheme.

In some embodiments of the present invention, the electron beam is shaped by projecting a light pattern corresponding to each frame image onto a photocathode, which then emits electrons in a spatial pattern proportional to the incident light intensity. In other embodiments, an array of miniature electron beam blankers is operated to modulate the electron beam directly.

In some embodiments of the present invention, the master image corresponds to an integrated circuit production mask, and the systems and methods described herein are used in direct writing of the circuit patterns in the mask onto semiconductor wafers. In other embodiments, these systems and methods may be used in creating masks and reticles for use in projection lithography, as well as in patterning flat panel displays and other types of electronic circuits, and in other applications in which high-resolution master images must be written onto a substrate with high accuracy.

There is therefore provided, in accordance with an embodiment of the present invention, a method for writing a master image on a substrate, including:

dividing the master image into a matrix of frames, each frame including an array of pixels defining a respective frame image in a respective frame position within the master image;

scanning an electron beam in a raster pattern over the substrate; and shaping the electron beam responsively to the respective frame image of each of the frames as the electron beam is scanned over the respective frame position on the substrate, so that in each frame, the electron beam simultaneously writes a multiplicity of the pixels onto the substrate.

Typically, each of the pixels has a respective pixel value, and shaping the electron beam includes writing all the pixels having the same pixel value in the respective frame image substantially simultaneously, and possibly writing all the pixels substantially simultaneously. Additionally or alternatively, shaping the electron beam includes writing all the pixels in each frame within a short period of time, before scanning the electron beam to a successive frame in the raster pattern. Further additionally or alternatively, shaping the electron beam includes focusing the electron beam onto the substrate so that at each position in the scan, the focused electron beam covers an area of a single frame.

In a disclosed embodiment, scanning the electron beam includes mechanically scanning the substrate along a primary scan direction, and electrically scanning the electron beam in a secondary scan direction, transverse to the primary scan direction. Typically, mechanically scanning the substrate includes moving the substrate in the primary scan direction substantially continuously, and electrically scanning the electron beam includes electrically shifting the electron beam in the primary scan direction so as to compensate for motion of the substrate. Additionally or alternatively, electrically scanning the electron beam includes scanning the electron beam in the secondary scan direction in steps corresponding to the frames in a row of the matrix.

Alternatively, mechanically scanning the substrate may include stepping the substrate to the desired locations, thus eliminating the need for electrical compensation of the electron beam.

In some embodiments, shaping the electron beam includes dividing the electron beam into multiple beamlets, and selectively blocking the beamlets responsively to the respective frame image of each of the frames. Typically, each of the pixels has a respective pixel value, and selectively blocking the beamlets includes controlling a duration of blocking each of the beamlets responsively to the respective pixel value. Additionally or alternatively, selectively blocking the beamlets includes selectively deflecting the beamlets so that the deflected beamlets do not impinge on the substrate. Selectively deflecting the beamlets may include directing each of the beamlets through a respective aperture among a plurality of apertures in a multi-blanker array, and applying a deflecting field in the respective aperture. In a disclosed embodiment, the multi-blanker array includes a semiconductor substrate, through which the apertures are etched, having electrodes formed thereon for applying the deflecting field.

Typically, scanning the electron beam includes applying a controlled deflection to the beamlets that are not blocked. Additionally or alternatively, shaping the electron beam further includes focusing the beamlets so as to demagnify the frame image formed by the beamlets that impinge on the substrate. In a disclosed embodiment, focusing the beamlets includes forming the frame image on the substrate with a pixel size approximately in the range of 25 to 35 nm.

In other embodiments, shaping the electron beam includes modulating a beam of optical radiation responsively to the respective frame image of each of the frames, and converting the modulated beam of optical radiation into the shaped electron beam. Typically, converting the modulated beam of optical radiation includes directing the modulated beam of optical radiation to impinge on a photocathode, so that the photocathode emits electrons responsively to the optical radiation, and shaping the electron beam further includes accelerating the electrons emitted by the photocathode toward the substrate. Scanning the electron beam typically includes applying a controlled deflection to the accelerated electrons.

Additionally or alternatively, directing the modulated beam of optical radiation includes focusing the modulated beam of optical radiation so as to form a demagnified image on the photocathode, and accelerating the electrons includes focusing the electrons that impinge on the substrate so as to further demagnify the demagnified image. In a disclosed embodiment, modulating the beam of optical radiation includes creating an optical image having a first pixel size, and focusing the electrons that impinge on the substrate includes forming an electron image having a second pixel size that is less than about $\frac{1}{100}$ of the first pixel size. Typically, the second pixel size is less than about $\frac{1}{400}$ of the first pixel size, and focusing the electrons that impinge on the substrate includes forming an electron image having a pixel size approximately in the range of 25 to 35 nm.

In disclosed embodiments, modulating the beam of optical radiation includes directing the beam of optical radiation to impinge on spatial light modulator (SLM) including at least one array of micromirrors, and controlling respective states (or orientations) of the micromirrors responsively to the respective frame image. Typically, each of the micromirrors corresponds to a pixel in the respective frame image and has an "on" position and an "off" position, and controlling the respective states includes setting a respective time during which each of the micromirrors is to be in the "on" position responsively to the corresponding pixel in the respective frame image. Setting the respective time may include controlling a length of time during which each of the micromirrors is to be in the "on" position responsively to a gray-scale pixel value of the corresponding pixel. Alternatively, directing the beam of optical radiation includes varying an intensity of the beam of optical radiation so that the intensity has different values in a plurality of different time slots, and setting the respective time includes selecting the time slots during which each of the micromirrors is to be in the "on" position responsively to a gray-scale pixel value of the corresponding pixel.

In another embodiment, the at least one array of micromirrors includes a plurality of arrays of micromirrors, which are aligned in mutual registration such that each of the micromirrors in each of the arrays corresponds to a pixel in the respective frame image and has an "on" position and an "off" position, and directing the beam of optical radiation includes directing at least a portion of the beam of optical radiation to impinge on each of the plurality of the arrays so that the arrays of micromirrors create respective partial frame images having respective sets of intensity levels, and combining the partial frame images to produce the frame image. Typically, directing at least the portion of the beam of optical radiation includes directing at least the portion of the beam to impinge on the arrays in succession, so that the partial frame images are created sequentially and not simultaneously.

In a disclosed embodiment, the substrate includes a semiconductor wafer, and the master image includes a circuit pattern, and scanning and shaping the electron beam includes writing the circuit pattern on the wafer.

There is also provided, in accordance with an embodiment of the present invention, a method for writing a master image on a substrate, including:

dividing the master image into a matrix of frames, each frame including an overlap region in which the frame overlaps one or more other frames adjacent thereto in the matrix;

identifying a feature of the master image in the overlap region between first and second frames in the matrix; and writing the matrix of frames onto the substrate, while applying an overlap writing procedure to the identified feature.

Typically, applying the overlap writing procedure includes, if the feature does not extend outside the overlap region into either of the first and second frames, writing the feature in one of the first and second frames but not in the other of the first and second frames.

Additionally or alternatively, applying the overlap writing procedure includes, if the feature extends outside the overlap region into the first frame but not into the second frame, writing the feature in the first frame using a first writing procedure, and if the feature extends outside the overlap region into both the first and second frames, writing the feature in both the first and second frames using a second writing procedure, different from the first writing procedure. In a disclosed embodiment, writing the feature in the first frame using the first writing procedure includes writing the feature in the first frame but not in the second frame, and writing the feature in both the first and second frames using the second writing procedure includes blending a portion of the feature in the overlap region. Typically, blending the portion of the feature includes writing the portion of the feature with reduced intensity at some pixels in each of the first and second frames, so as to avoid discontinuity in the feature due to imperfect registration between the first and second frames.

There is additionally provided, in accordance with an embodiment of the present invention, a method for writing a frame image on a substrate, including:

directing a beam of radiation to impinge on the substrate;

shaping the beam responsively to a known reference pattern, so as to generate a reference image;

comparing the reference image to the reference pattern so as to map a distortion of the pattern;

modifying a frame pattern so as to correct for the mapped distortion; and shaping the beam responsively to the modified frame pattern so as to write the frame image on the substrate, thereby reducing the distortion in the frame image.

Typically, mapping the distortion includes mapping a displacement of one or more pixels in the reference image. Additionally or alternatively, mapping the distortion includes computing an inverse transformation to the distortion, and wherein modifying the frame pattern includes applying the inverse transformation to the frame pattern. Comparing the reference image to the reference pattern may further include detecting a deviation in the image comprising at least one of an image displacement, an image rotation and an intensity deviation of one or more pixels in the reference image, wherein modifying the frame pattern includes correcting for the deviation. Typically, the beam of radiation includes an electron beam.

There is further provided, in accordance with an embodiment of the present invention, a method for generating an electron beam, including:

enclosing a photocathode in an enclosure, which includes a window and a membrane;

irradiating the photocathode through the window with modulated optical radiation so as to cause the photocathode, responsively to the modulated optical radiation, to generate a modulated beam of electrons; and directing the electrons so that the modulated beam exits the enclosure through the membrane.

Typically, enclosing the photocathode in the enclosure includes evacuating the enclosure so as to reduce a partial pressure of oxygen in the enclosure to less than about $10^{-7}$ torr.

In a disclosed embodiment, the membrane has a thickness less than 1 µm, and possibly less than 100 nm.

In a further embodiment, irradiating the photocathode includes irradiating a portion of the photocathode, causing the electrons to exit the enclosure through an area of the membrane, and directing the modulated optical radiation so as to vary the portion of the photocathode that is irradiated, so that the area of the membrane through which the electrons exit the enclosure varies accordingly.

There is moreover provided, in accordance with an embodiment of the present invention, apparatus for writing a master image on a substrate, including:

a controller, which is adapted to divide the master image into a matrix of frames, each frame including an array of pixels defining a respective frame image in a respective frame position within the master image;

a translation device, which is adapted to cause an electron beam to scan over the substrate in a primary scan direction;

electron optics, which are adapted to scan the electron beam in a secondary scan direction, transverse to the primary scan direction, so that the electron beam is scanned in a raster pattern over the substrate; and an electron beam generator, which is adapted to generate and shape the electron beam responsively to the respective frame image of each of the frames as the electron beam is scanned over the respective frame position on the substrate, so that in each frame, the electron beam simultaneously writes a multiplicity of the pixels onto the substrate.

In a disclosed embodiment, the translation device includes a translation stage, which is adapted to translate the substrate along the primary scan direction.

In some embodiments, the electron beam generator includes a multi-lens array, which is adapted to divide the electron beam into multiple beamlets, and a multi-beam blanker, which is aligned to selectively block the beamlets responsively to the respective frame image of each of the frames. In one embodiment, the multi-beam blanker includes a plurality of apertures, which are aligned so that each of the beamlets passes through a respective aperture among the plurality of apertures, and electrodes, which are respectively associated with each of the apertures, and are coupled to apply a deflecting field in the respective aperture. The multi-blanker array may include a semiconductor substrate, through which the apertures are etched, and on which the electrodes are formed in proximity to the respective apertures.

In another embodiment, the electron beam generator includes an optics module, which is adapted to modulate a beam of optical radiation responsively to the respective frame image of each of the frames, and a photocathode, on which the modulated beam of optical radiation is incident, and which is adapted to emit electrons responsively to the optical radiation, so as to generate and shape the electron beam. Typically, the optics module includes an optical objective, which is adapted to focus the modulated beam of optical radiation so as to form a demagnified image on the cathode, and the electron optics include an electron objective, which is adapted to focus the electrons that impinge on the substrate so as to further demagnify the demagnified image. Additionally or alternatively, the optics module includes a spatial light modulator (SLM) including at least one array of micromirrors, on which the beam of optical radiation is incident, and the controller is coupled to cause the SLM to modulate the beam of optical radiation by controlling respective orientations of the micromirrors responsively to the respective frame image.

There is furthermore provided, in accordance with an embodiment of the present invention, apparatus for writing a master image on a substrate, including:

a radiation source, which is adapted to write a matrix of frames onto a substrate; and a controller, which is adapted to divide the master image into the matrix of frames to be written by the radiation source, each frame including an overlap region in which the frame overlaps one or more other frames adjacent thereto in the matrix, wherein the controller is adapted to identify a feature of the master image in the overlap region between first and second frames in the matrix, and to cause the radiation source to write the matrix of frames onto the substrate while applying an overlap writing procedure to the identified feature.

There is also provided, in accordance with an embodiment of the present invention, apparatus for writing a frame image on a substrate, including:

a radiation source, which is adapted to direct a beam of radiation to impinge on the substrate; and a controller, which is coupled to cause the radiation source to shape the beam responsively to a known reference pattern, so as to generate a reference image, and which is adapted to compare the reference image to the reference pattern so as to map a distortion of the pattern, and which is further adapted to modify a frame pattern so as to correct for the mapped distortion, and to cause the radiation source to shape the beam responsively to the modified frame pattern so as to write the frame image on the substrate, thereby reducing the distortion in the frame image.

There is additionally provided, in accordance with an embodiment of the present invention, apparatus for generating an electron beam, including:

an evacuable enclosure, which includes an optical window adapted for passage of modulated optical radiation therethrough and a membrane adapted for passage of an electron beam therethrough;

a photocathode, which is arranged in the enclosure so that the modulated optical radiation impinges on the photocathode, and which is adapted, responsively to the modulated optical radiation, to generate a modulated beam of electrons; and electron optics, associated with the enclosure, which are configured to direct the modulated beam of electrons through the membrane.

The present invention will be more fully understood from the following detailed description of the embodiments thereof, taken together with the drawings in which:

BRIEF DESCRIPTION OF THE DRAWINGS

FIG. 10 is a timing diagram showing signals used in controlling the optics module of FIG. 9, in accordance with an embodiment of the present invention;

DETAILED DESCRIPTION OF EMBODIMENTS

System Overview

Figure 1:
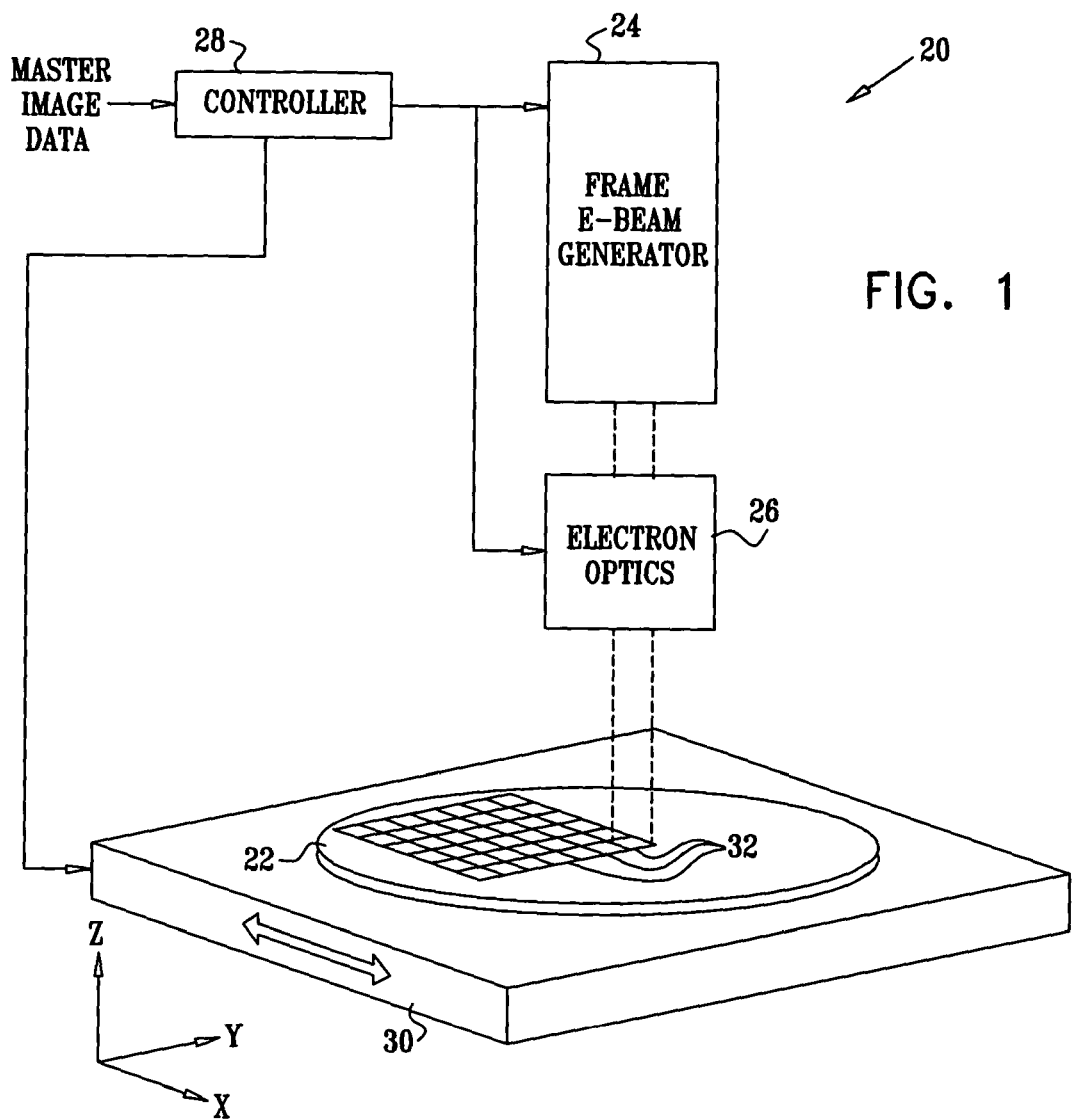
FIG. 1 is a schematic, partly pictorial illustration of a system for direct-write lithography, in accordance with an embodiment of the present invention.

FIG. 1 is a schematic, partly pictorial illustration of a system 20 for direct-write lithography on a semiconductor wafer 22, in accordance with an embodiment of the present invention. A master image, which typically contains image features corresponding to a layer of circuit elements to be formed on wafer 22, is divided up into a matrix of frames 32 by a controller 28. Each frame 32 contains a frame image, which is a small subset of the master image. An electron beam (e-beam) generator 24 generates an electron beam, which is scanned over wafer 22 in a raster pattern by electron optics 26, operating in conjunction with a translation device, such as a translation stage 30 on which wafer 22 is mounted. Optics 26 focus the electron beam to a size on wafer 22 that is equal to the size of a single frame. As the electron beam is scanned over the position of each of the frames in the raster pattern, e-beam generator 24 spatially shapes the beam so as to write the appropriate frame image in each position. Typically, the frame images are defined as gray-scale images, and the e-beam is modulated so as to write each pixel at the proper gray-scale intensity level. Controller 28 monitors and controls the operation of e-beam generator 24, electron optics 26 and stage 30, as described hereinbelow.

Figure 2:
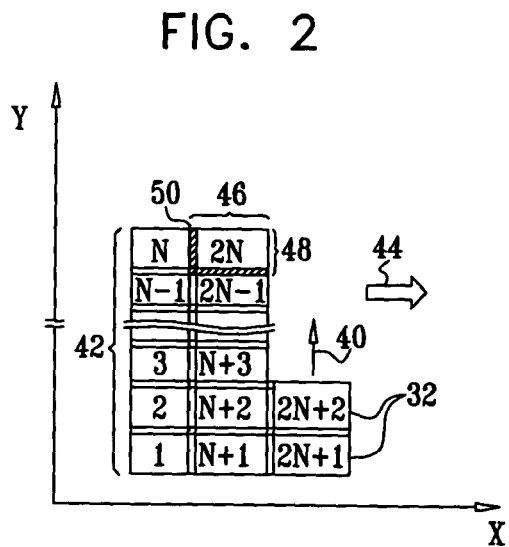
FIG. 2 is a schematic top view of a surface of a semiconductor wafer, illustrating a raster frame pattern applied to the surface by the system of FIG. 1, in accordance with an embodiment of the present invention.

FIG. 2 is a schematic top view of wafer 22, showing details of the raster pattern of frames 32, in accordance with an embodiment of the present invention. Here it is assumed that stage 30 scans wafer 22 in the primary scan direction, identified here as the X-direction, as indicated by an arrow 44 in FIG. 2. Meanwhile, electron optics 26 scan the electron beam across the wafer in the Y-direction, i.e., the secondary scan direction, transverse to the primary scan direction, as indicated by an arrow 40. The Y-direction scanning covers an area 42 that is approximately N frames wide. Frames 32 are labeled in FIG. 2 according to their sequential scan order. In other words, e-beam generator 24, electron optics 26 and stage 30 are timed so that the appropriate frame image is incident on wafer 22 in the scan position of each frame 32, and so that the scan covers a complete row of N frames in the Y-direction in the time it takes stage 30 to advance by a single frame in the X-direction. After the electron beam writes frame N, optics 26 return the beam to write frame N+1 at the beginning of the next row, and so forth.

Typically, each frame 32 includes about 1000×1000 pixels, with a pixel pitch on wafer 22 between about 25 and 35 nm. Thus, each frame has a height 46 and a width 48 that are between about 25 and 35 µm, while N is typically between about 20 and 30. Based on these exemplary figures, it can be seen that a complete raster frame scan over wafer 22 in the X-direction covers a stripe whose width (in the Y-direction) is between 0.5 and 1 mm. Multiple parallel stripes may be scanned in this manner in order to cover the entire wafer surface. Furthermore, e-beam generator 24 and optics 26 may be controlled to scan over and write each frame multiple times, in order to ensure that the entire master image is accurately written on the wafer. Note that the above figures regarding frame size, pixel size and scan width are given here only by way of example. Pixel sizes, frame sizes and scan widths both greater than and less than these values may be used instead, depending on application requirements and system capabilities.

The frame images to be written onto wafer 22 are typically defined prior to beginning the scan of the wafer in system 20, by dividing up the master image into a matrix of frames 32 of the appropriate size. Controller 28 loads each frame image into e-beam generator 24 at the appropriate point in the scan. In order to avoid discontinuities in features written on wafer 22 due to imperfect registration between different frames, the frames are preferably defined so that each frame overlaps with its neighbors. Typically, an overlap region 50 between adjacent frames of 1000×1000 pixels is about 10% of the frame width, for example, 128 pixels wide. The frame images are adjusted to ensure that features that fall inside overlap region 50 are written properly on wafer 22, as described hereinbelow with reference to FIGS. 4A and 4B. Alternatively, non-overlapping frames may be used.

Figure 3A:
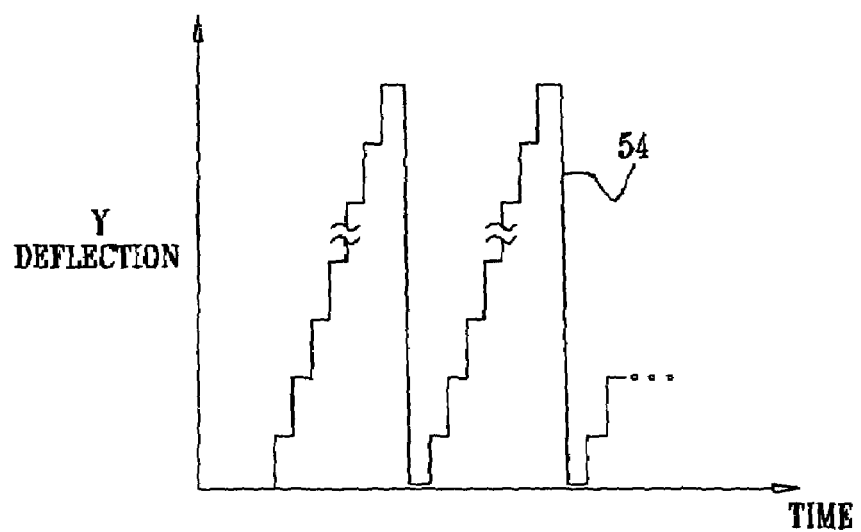
FIGS. 3A and 3B are schematic plots of electrical signals used to control scanning of an electron beam, in accordance with an embodiment of the present invention.
Figure 3B:
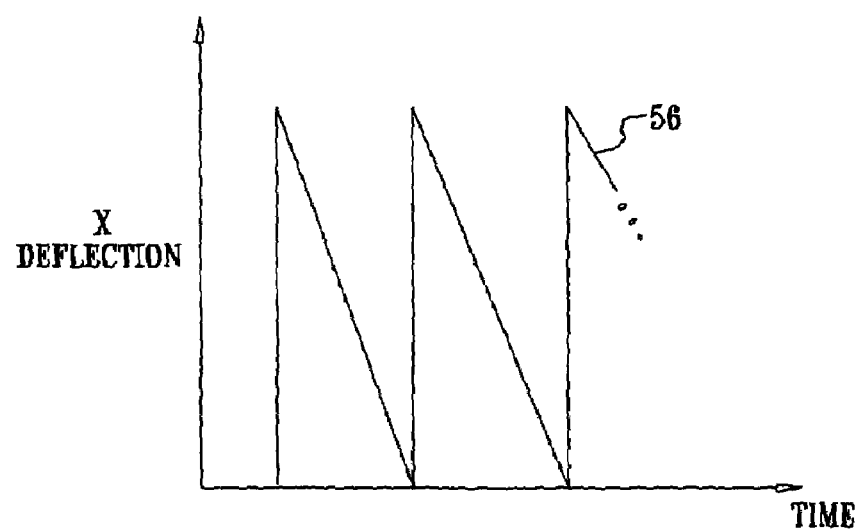

FIGS. 3A and 3B are schematic plots of electrical signals 54 and 56, which are used in controlling deflection of the electron beam by optics 26, in accordance with an embodiment of the present invention. Signal 54, which controls the Y-direction scan, comprises a sequence of N steps, separated in time by the frame period of e-beam generator 24, which is typically about 100 µs. Alternatively, longer or shorter frame periods may be used. After the Nth step, signal 54 retraces to the opposite end of the Y-direction scan to begin scanning the next row. Alternatively, signal 54 may be modified so that the next row may be scanned in the opposite direction.

Typically, stage 30 scans wafer 22 continuously in the X-direction. Alternatively, the X-direction scan may be accomplished by another translation device, which scans electron optics 26 or the electron beam itself in the X-direction while wafer 22 is stationary. To compensate for the X-direction motion of wafer 22 over the duration of each row scan in the Y-direction, signal 56 is applied to optics 26 in order to deflect the beam continuously in the X-direction. In other words, during each row scan, as stage 30 advances, optics 26 progressively deflect the beam in the opposite direction by the appropriate amount so that all the frames in the row are aligned at the same X-coordinates, and image blur due to the X-direction motion of the wafer is avoided.

Alternatively, the continuous mechanical scanning in the X direction may be replaced by stepping the stage to its desired location, thus eliminating the need for electrical compensation of the electron beam angle.

Preferably, stage 30 provides position feedback to controller 28 of both X- and Y-deviations, by means of interferometric position measurements, for example. Based on this feedback, the controller determines the precise amount by which the electron beam must be deflected, and adjusts signals 54 and 56 accordingly. Alternatively or additionally, other methods known in the art may be used for carrying out the X- and Y-direction scanning. For example, U.S. Pat. No. 6,262,429, whose disclosure is incorporated herein by reference, describes a scanning electron beam system that includes means for retrograde scanning, which may be applied in scanning the electron beam in system 20.

Generating Frame Images from the Master Image

Figure 4A:
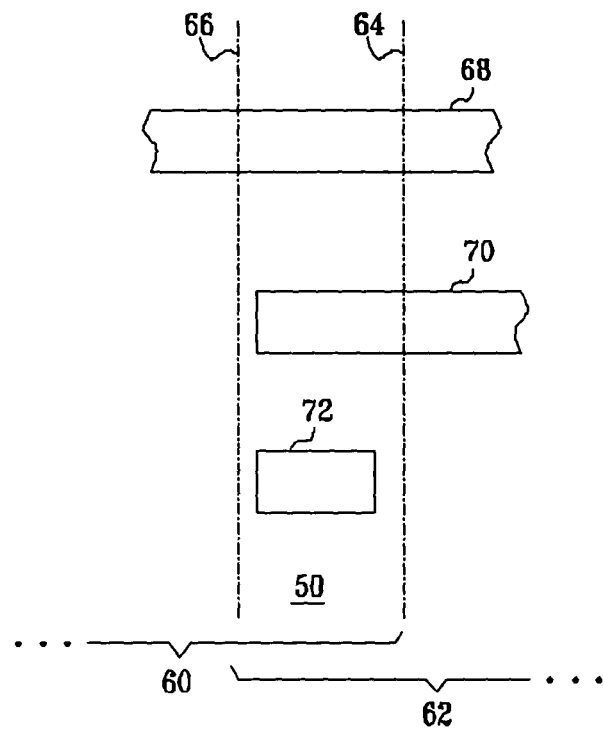
FIG. 4A is a schematic, enlarged view of features in an overlap region between two frames of a master image.

FIG. 4A is a schematic, enlarged view of overlap region 50 between two frames 60 and 62 in a master image to be written on a substrate. Overlap region 50 is bounded by a right edge 64 of frame 60 and a left edge 66 of frame 62. For the sake of simplicity, FIGS. 4A–4C and the following discussion refer to overlapping of frames at the horizontal (X) direction. The methods described below for treating overlap regions between frames may be applied, mutatis mutandis, to frame overlap in the vertical (Y) direction, as well as to regions in which four frames overlap at the corners of the frames.

Three types of image features are shown in FIG. 4A:

An extended feature 68, which crosses overlap region 50 and extends beyond the overlap region into both of frames 60 and 62;

A partially-extended feature 70, which continues from overlap region 50 into frame 62, but does not extend beyond the overlap region into frame 60; and A confined feature 72, which is completely contained within overlap region 50.

In generating the frame images to be used by e-beam generator 24, controller 28 (or an image pre-processor, not shown in the figures) treats each of these feature types differently.

Figure 4B:
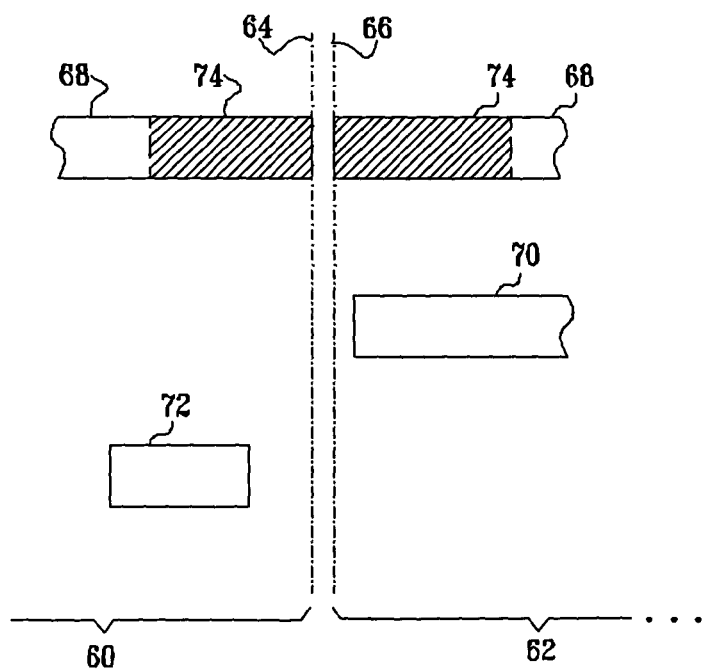
FIG. 4B is a schematic, enlarged view of a portion of the two frames shown in FIG. 4A, illustrating frame images of the two frames to be written on a substrate, in accordance with an embodiment of the present invention.

FIG. 4B is a schematic, enlarged view of portions of the frame images of frames 60 and 62, based on the feature type classifications described above, in accordance with an embodiment of the present invention. Extended feature 68 is reproduced in both of frames 60 and 62, using a first writing procedure to deal with the overlap. This writing procedure is applied in such a way that portion 74 of the extended feature that is located in overlap region 50 is blended, however, in order to minimize the possible effect of misregistration between the frames. Typically, the intensity of the pixels in portion 74 in each of the frames is reduced, so that the sum of the intensities at each pixel is equal to the total intensity of the original feature 68 in the master image.

Figure 4C:
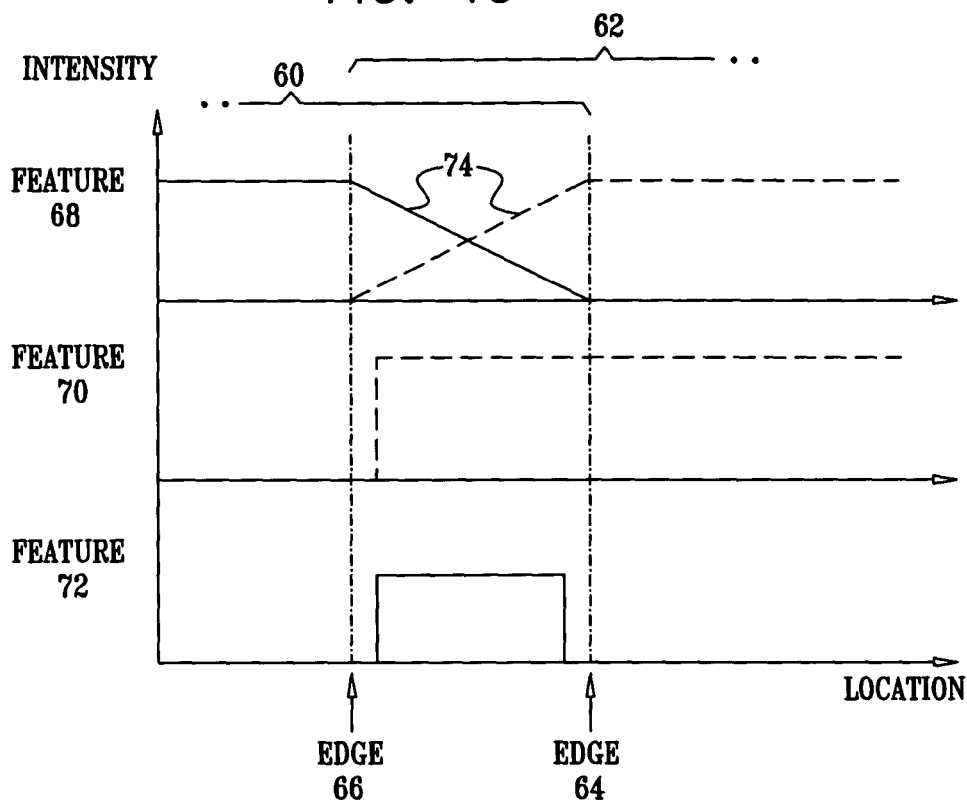
FIG. 4C is a schematic plot of intensity as a function of position of an electron beam that is used to write the features shown in FIG. 4A, in accordance with an embodiment of the present invention.

FIG. 4C is a schematic plot of the intensity of the electron beam that is used to write features 68, 70 and 72 in frames 60 and 62, in accordance with an embodiment of the present invention. The beam intensity used to write frame 60 is shown by solid lines in this figure, while that used to write frame 62 is shown by dashed lines. In this example, the intensity of portion 74 in frame 60 decreases gradually from left to right, while the intensity in frame 62 decreases gradually from right to left in frame 62. Alternatively, the intensity reduction method described in the above-mentioned U.S. Pat. No. 6,285,488 may be used for this purpose.

Figure 4D:
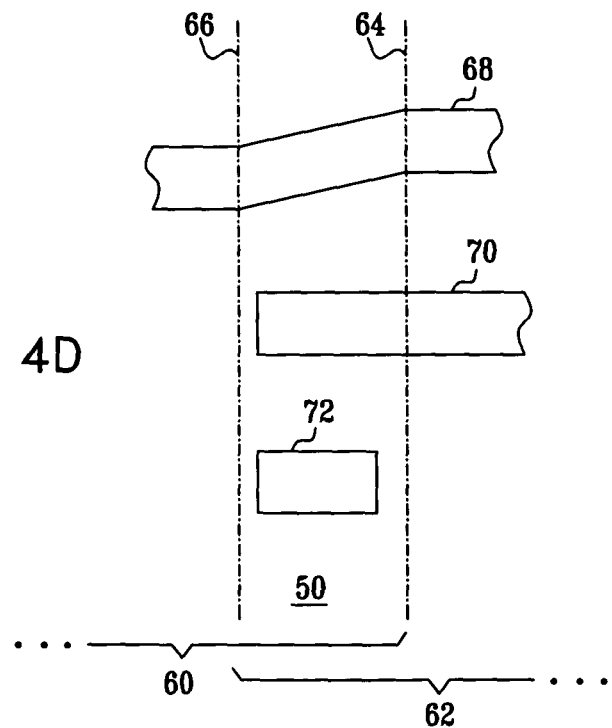
FIG. 4D is a schematic, enlarged view of the features in the overlap region of FIG. 4A, showing blending of certain features in accordance with an embodiment of the present invention.

FIG. 4D is a schematic, enlarged view of overlap region 50 between frames 60 and 62 as written on wafer 22 following application of the blending procedure described above, in accordance with an embodiment of the present invention. In the example shown here, frame 60 is displaced vertically relative to frame 62 when the frames are written on wafer 22, as may occur due to any system misalignment. In this case, the portion of feature 68 in overlap region 50 (as a result of the blending shown in FIG. 4B) has the form of a diagonal connecting the mutually-offset horizontal portions of the feature outside the overlap region. This sort of diagonal connection will have minimal or no effect on the integrated circuit of which it forms a part. If blending were not used, there would be a sharp step in feature 68 between frames 60 and 62, which could affect circuit performance.

Partially-extended feature 70, on the other hand, is reproduced only in frame 62. In this case, a second writing procedure is used, in which feature 70 is reproduced in frame 62 at full intensity, as illustrated in FIGS. 4B and 4C. There is no need to blend this feature, since it will be accurately reproduced regardless of any misregistration between frames 60 and 62. Similarly, there is no need to blend confined feature 72. Therefore, feature 72 is reproduced only in frame 60 (or it may alternatively be reproduced only in frame 62). Assignment of feature 72 to one of the frames is arbitrary, and any suitable assignment rule may be used for dealing with contained features of this sort. The selective blending illustrated by FIGS. 4B–4D, in which only features extending beyond the overlap region into both adjacent frames are blended, is useful in ensuring that partially-extended and confined features are not blended unnecessarily, and are therefore reproduced on wafer 22 with maximal fidelity.

Alternatively, other blending methods may be applied in overlap region 50. For example, feature 72 may be printed in both frames 60 and 62 at half intensity in each, so as to average the system errors. Further alternatively, a feature-independent blending method, such as "always blend" or "never blend," may be applied.

Note that the definition of overlap regions 50 and blending of features in the overlap regions may take place either before or after rasterization of the frame images, as described below with reference to FIG. 6.

Figure 5:
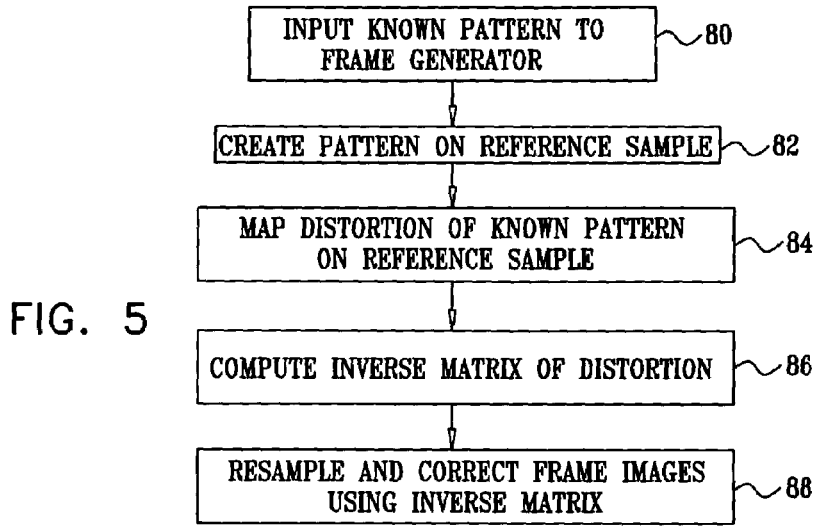
FIG. 5 is a flow chart that schematically illustrates a method for correcting image distortion, in accordance with an embodiment of the present invention.

FIG. 5 is a flow chart that schematically illustrates a method for generating frame images to be written by e-beam generator 24 so as to compensate for distortions introduced by the e-beam generator and by electron optics 26, in accordance with an embodiment of the present invention. This method is typically used to correct for distortions of low spatial frequency (relative to the pixel density), such as barrel and pincushion distortion. For this purpose, the distortions are first mapped, by inputting a known, reference image pattern to e-beam generator 24, at a reference input step 80. The e-beam generator modulates the electron beam in accordance with the reference image pattern, and optics 26 focus the modulated beam onto a reference sample, at a pattern creation step 82. For example, the reference pattern may comprise a set of well-defined, straight edges or other regular geometrical elements, and the reference sample may comprise a substrate with an overlying layer of photoresist, which is then etched to form the pattern on the substrate.

Alternatively, other reference patterns may be used, and the reference sample may comprise any other suitable medium or device that is capable of recording the intensity of a microscopic electron beam pattern. For example, an electron sensor, such as an e-beam sensitive camera, may be used to directly record the e-beam image of the reference pattern in real time at step 82.

The reference pattern that is formed on the test sample (or captured by a recording device) in this manner is compared to the original reference image in order to map the distortion of the image, at a mapping step 84. The comparison may be carried out, for example, by capturing an image of the pattern on the test sample, using an optical or electron microscope, for example. Based on this mapping, the displacement (offset) of each pixel in the input reference image is determined, relative to the position of the pixel in the captured image of the reference pattern formed by the electron beam, at a matrix computation step 86. The matrix represents, in effect, the inverse of the image distortion, indicating the amount by which each pixel in the captured image must be shifted in the X- and Y-directions in order to recover the original, undistorted image. To reduce the computational load, the shifts may be computed for blocks of pixels, rather than individual pixels.

Before printing the frame images on wafer 22, the gray-scale values of the pixels are resampled using the offset matrix, at a resampling step 88. This step has the effect of moving each pixel by the appropriate displacement amount, but in the opposite direction to the actual, measured displacement, in order to "pre-distort" the individual frame images. In this manner, the distortion of e-beam generator 24 and optics 26 is corrected in the actual frame images that are written on wafer 22. In other words, the inverse transformation to the actual distortion is applied to the frames.

Resampling the pixel values at step 88 may cause edges in the pre-distorted frame image to blur, since after resampling the edge may contain more than a single gray pixel (between the black and white pixel values on either side of the edge). In order to eliminate this sort of blur, a sharpening filter is typically applied to the resampled image at step 88. The sharpening filter runs over the resampled pixel values on the edges in the frame image and recalculates their values so that a section line through any given edge contains no more than a single gray pixel. Note, however, that the pixels in the electron beam itself are typically Gaussian in shape. Therefore, a simple linear adjustment of the gray-scale values at the edges will actually have a non-linear effect on the displacement of the edge in the image written on wafer 22. The magnitude of this non-linear effect may be determined in advance and stored in a lookup table, which is then used in applying a final correction to the value of each pixel along each of the edges in the frame image based on the distance of the pixel from the actual edge.

In addition to the method of FIG. 5, further calibration procedures are typically used to correct for other distortions and non-uniformities in system 20. For example, image displacement and rotation introduced by optics 26 may be measured and corrected by realignment of the optics. Deviations in image intensity due to non-uniformities in e-beam generation and/or focusing, as well as deviation in the intensities of individual pixels (which may arise from defects in the modulator used in shaping the electron beam in e-beam generator 24) may be measured and corrected using a look-up table. Other means of correction will be apparent to those skilled in the art. Alternatively, such calibration procedures and the resulting corrections may be incorporated in the method of FIG. 5.

Although the embodiments of FIGS. 4A, 4B and 5 are described here with reference to system 20, and the use of an electron beam to write lithographic patterns on wafer 22, the principles of these embodiments may similarly be applied to writing high-resolution images on a substrate using other systems and other types of radiation sources.

Electron Beam Generation Using an Optical SLM

Figure 6:
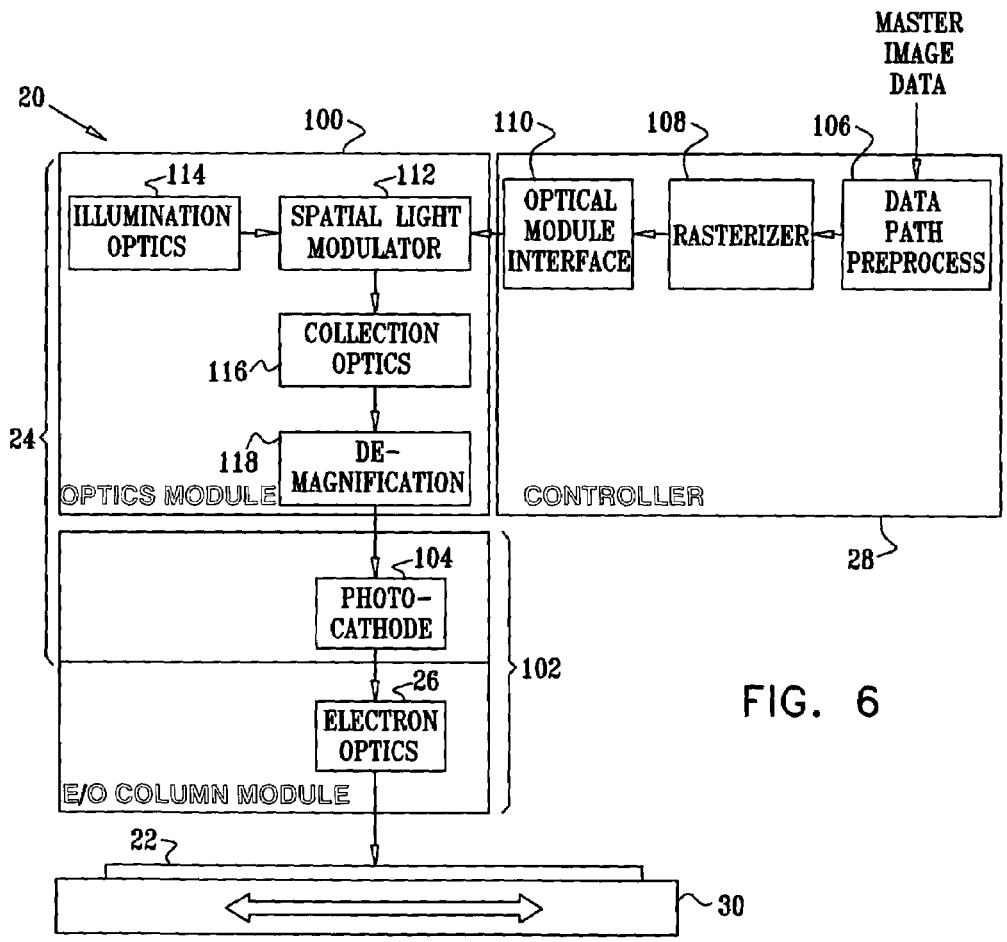
FIG. 6 is a block diagram that schematically shows functional elements of a system for direct-write lithography, in accordance with an embodiment of the present invention.

FIG. 6 is a block diagram showing functional elements of system 20, in accordance with an embodiment of the present invention. In this embodiment, system 20 comprises an optics module 100 and an electron optics (E/O) column module 102, which operate in concert to modulate the successive frame images onto the electron beam. Module 100 generates the frame images in the form of optical images, using a spatial light modulator (SLM) 112, as described below. These optical images are focused onto a photocathode unit 104, which generates the electron beam with spatially-modulated intensity, in proportion to the intensity of the incident light, as determined by the SLM. Typically, SLM 112 generates gray-scale images with resolution of 6–8 bits/pixel, in order to enhance the resolution of the image features in the master image that are written on wafer 22. The resolution enhancement of a gray-scale image with n gray levels, relative to a binary image with the same pixel size, can be as great as 1/n. Exemplary gray-scale SLM implementations for this purpose are described below with reference to FIGS. 8 and 9.

Controller 28 generates input signals to control SLM 112 so as to create the desired frame images. For this purpose, a data path preprocessor 106 divides the master image to be written on wafer 22 into a matrix of frame images, as illustrated in FIG. 2. Preprocessor 106 also performs any required blending or separation of features in overlap regions 50 between frames, as shown in FIG. 4B, and corrects for image distortions, typically using the method of FIG. 5. The preprocessor may also adjust parameters of the frame images to compensate for artifacts of the lithography process, such as electron beam fogging, proximity effects due to back-scattered electrons (which may occur on the wafer particularly in densely-patterned areas of the image) and etch loading. Typically, the gray levels of pixels in these areas are modified to offset the undesired electron beam effects. In addition, the preprocessor may perform "data healing," i.e., resolving and correcting for overlaps of the shapes to be written on the wafer, as is known in the art.

A rasterizer 108 converts each frame image into a string of data values, each corresponding to the gray-scale intensity of a successive pixel of SLM 112, arranged in row- and column-order. The definition of the frames to be written on wafer 22 and blending in the overlap regions of the frames may alternatively take place after this rasterization step. In this case, the master image is rasterized once, on a global basis, followed by dividing the rasterized image into frame images with appropriate blending and other corrections.

An optical module interface 110 then converts the data values into control input signals to SLM 112. The type of signals required depends on the type of SLM that is used, as described further hereinbelow. Typically, interface 110 comprises an array of memory buffers, which are written by rasterizer 108 and then read out to SLM 112 using a double-buffering technique. Given a frame rate of 10 kHz (i.e., 10,000 frames per second written on wafer 22), with 1000×1000 pixels per frame, the optical module interface must be capable of processing 10 Gpixels/sec, typically at 8 bits/pixel.

Possible implementations of optics module 100 are described in greater detail with reference to FIGS. 8 and 9. Briefly, illumination optics 114 generate a spatially-uniform beam of light, which illuminates SLM 112. Typically, the illumination optics comprise a laser, with suitable beam conditioning and scanning optics, as described below. SLM 112 is controlled to create a variable intensity pattern across the illuminating beam. The spatially-modulated beam from the SLM is imaged by collection optics 116 into an objective 118, which demagnifies and focuses the beam onto the photocathode in unit 104.

Each frame image is actually demagnified twice: once by objective 118, and then again by electron optics 26. Total demagnification of at least 100× is desirable. Assuming SLM 112 has a pixel pitch of 13 μm (typical of commercially-available SLM devices based on micro-mirror arrays), a total demagnification of about 400–500× is required in order to reach the target pixel size of 25–35 nm on wafer 22. To achieve this desired total demagnification, objective 118 typically demagnifies the image of the SLM by about 25×. Assuming illumination optics 114 output a laser beam in the blue or green spectral range, this demagnification reduces the pixel size on the photocathode to approximately the diffraction limit minimum.

Figure 7:
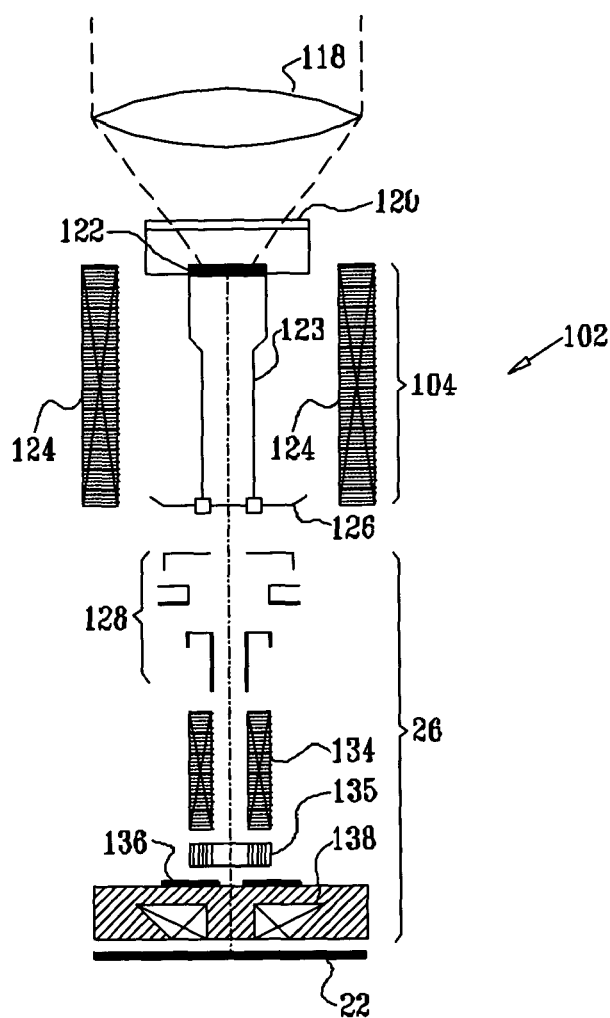
FIG. 7 is a schematic, sectional view of an electron beam module for generating a spatially-modulated electron beam, in accordance with an embodiment of the present invention.

FIG. 7 is a schematic, sectional view of E/O column module 102, in accordance with an embodiment of the present invention. The spatially-modulated light beam from SLM 112 is focused by objective 118, as noted above, through a window 120 onto a photocathode 122. Typically, photocathode 122 has fast temporal response (>1 MHz), high uniformity, and high photoyield (>20 μA/mW of optical power), with the possibility of operating at high current density (>0.1 A/cm$^2$) and optical power density that may be in excess of 10 W/cm$^2$. A bi-alkali or multi-alkali photocathode may be capable of meeting these requirements.

Alternatively, the specifications of photocathode 122 may be relaxed, at the expense of reduced throughput of system 20.

In order to maximize the lifetime of photocathode 122, it is advantageous to exclude heavy molecules, such as oxygen and water vapor, from the area of the photocathode during operation. It is desirable that the partial pressures of such molecules be on the order of $10^{-7}$ to $10^{-9}$ torr, or even lower. Although the lithography chamber (not shown) in which wafer 22 is irradiated by the electron beam is itself evacuated, it is not generally possible to pump the heavy molecules out of the chamber down to the desired partial pressure in a reasonable amount of time. Therefore, photocathode 122 is preferably contained in a separate enclosure 123, which is closed off on one side by window 120 and on the other side by a thin protective membrane 126. This arrangement allows enclosure 123 to be pumped out independently of the rest of the chamber.

Another advantage of keeping photocathode 122 inside enclosure 123 is that material that vaporizes off the photocathode during operation remains contained inside the enclosure. Consequently, some of this vaporized material redeposits on the photocathode, thus slowing the degradation of the photocathode due to material loss.

Membrane 126 is made as thin as is feasible in order to minimize interference with the electrons emitted from photocathode 122. The membrane is preferably less than 1 μm thick, and is most preferably 100 nm thick or less. The membrane must be made of a material with sufficient mechanical rigidity to prevent fracture and shifting of position even at this very low thickness. It should also have high thermal conductivity and electrical conductivity, in order to prevent thermal effects and charging of the membrane by the electron beam. Suitable materials for these purposes include silicon, silicon nitrides, silicon carbide and diamond-like carbon (DLC).

Even under the desired high-vacuum conditions, photocathode 122 and membrane 126 will still be subject to degradation over time, due to the high electron flux levels to which they are exposed. On the other hand, the size of the area on the photocathode that is activated by the beam from optics module 100 is relatively small—typically on the order of 0.5×0.5 mm—as is the area of membrane 126 through which the electron beam passes. In order to extend the lifetime of the photocathode and membrane, the photocathode may be made considerably larger, with a diameter of several millimeters or more. The optics module may be periodically shifted relative to the photocathode (typically once in several hundred hours of operation), or the optics may be readjusted, so as to activate different areas of the photocathode. Shifting the active area of the photocathode also shifts the area of membrane 126 through which the electron beam passes.

The electron optics in module 102 are designed to focus the spatially-modulated electron beam generated by photocathode 122 onto wafer 22 with high accuracy and with demagnification of about 15×, so that the pixel size of 400–500 nm at the photocathode is reduced to a pixel size of 25–35 nm on the wafer. Alternatively, as noted above, greater or lesser levels of demagnification may be used. At the same time, the electron optics accelerate the electrons, typically to an energy of about 50 keV at impact on wafer 22, as well as scanning the electron beam in the X- and Y-directions, as described above with reference to FIG. 2. (The 50 keV electron energy is suitable for writing on photoresist materials known in the art. Alternatively, a retarding lens may be added in optics 26 in order to reduce the electron impact energy if desired.) To maintain accurate reproduction of the electron image from photocathode 122 onto wafer 22 over the entire scan, the electron optics are preferably telecentric, with total aberrations no greater than about 3 nm, and depth of focus >1 μm in order to accommodate possible height deviations in the wafer surface plane.

The first element in the electron optics column in module 102 is an illumination lens 124, surrounding enclosure 123, which images the electron distribution at photocathode 122 onto the plane of membrane 126 with unit magnification. Lens 124 generates a homogeneous magnetic field along the electron trajectory and an electrostatic field to accelerate the electrons. An electrostatic field lens 128, typically operating at a potential of 50 kV, accelerates the electrons. The field lens is useful in reducing chromatic aberrations and Coulomb interaction.

A collimator 134 focuses the accelerated electron beam through an aperture 136, which eliminates off-axis rays. A beam deflector 135 deflects the beam along the primary and secondary scan directions (X- and Y-axes) as described above with reference to FIGS. 2, 3A and 3B. The beam is then focused and demagnified onto wafer 22 by an objective 138. Various designs of the beam deflector and objective may be used for these purposes, including doublet and moving objective lens designs, as are known in the art. To meet the requirements of high beam stability and large depth of focus, as specified above, objective 138 typically has a small numerical aperture, which may be on the order of several mrad.

Figure 8:
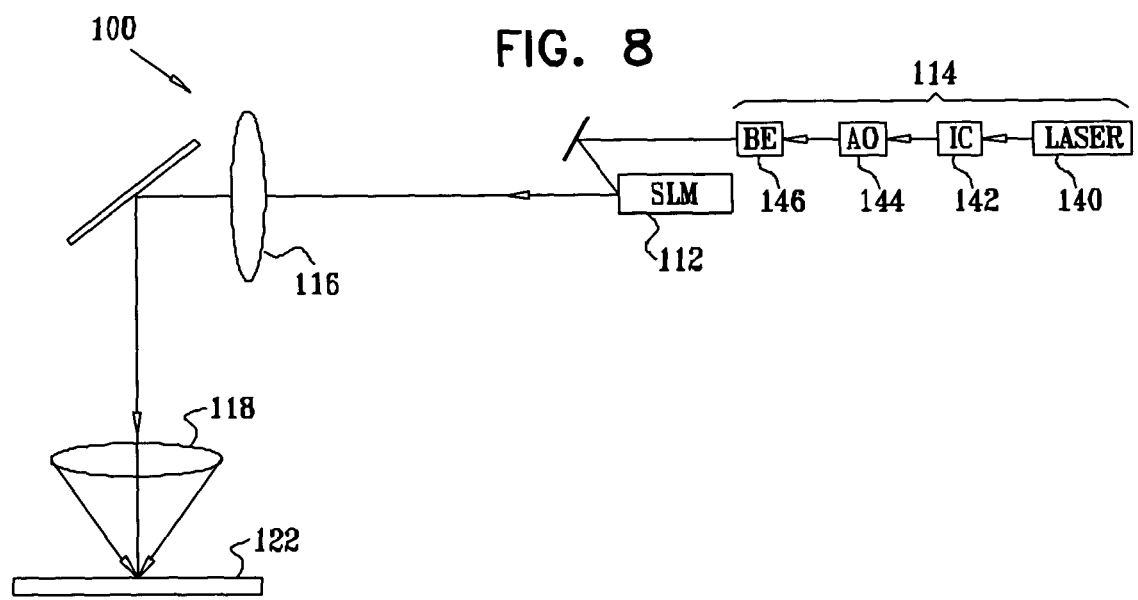
FIG. 8 is a schematic side view of an optics module used in creating a spatially-modulated optical beam, in accordance with an embodiment of the present invention.

FIG. 8 is a schematic side view of optics module 100, in accordance with an embodiment of the present invention. In this embodiment, SLM 112 comprises an array of micromirrors, such as a Digital Micromirror Device (DMD) produced by Texas Instruments DLP Products (Plano, Tex.). The SLM is controlled by controller 28 so as to generate the succession of gray-scale frame images at high speed, as described briefly hereinbelow. Further details and variations on these spatial modulation methods and associated devices are described in the above-mentioned U.S. Patent Application Publication 2003/0122091. Alternatively, SLM 112 may be controlled to create binary images.

Further alternatively, other types of spatial light modulators and other control techniques, as are known in the art, may be used in generating the gray-scale image, as long as the devices and techniques are capable of operating at sufficient speed to meet the throughput requirements of system 20. Either reflective modulators (such as the above-mentioned DMD) or transmissive modulators (such as LCD-based devices) may be used. The modulator elements in the array may be operated using binary control, as described below, or they may alternatively be controlled in an analog mode (gray-level based). Analog or high-speed binary control (such as the PWM technique described below) may be used to write all the pixels in each frame on wafer 22 simultaneously. Alternatively, the pixels in each frame may be written in groups, wherein typically all pixels having the same intensity value are written simultaneously, as described hereinbelow.

A beam source, typically a laser 140, generates a beam of optical radiation, which may be pulsed or continuous wave (CW). The term "optical radiation," as used in the present patent application and in the claims, includes all wavelengths in the visible, ultraviolet and infrared ranges. Typically, a solid-state laser operating in the wavelength range between about 400 and 550 nm, with average output power between about 0.2 and 3 W, will provide adequate optical power on photocathode 122, depending on the required pixel size, speed and other system requirements. Alternatively, an ultraviolet laser may be used for enhanced optical resolution. An intensity converter (IC) 142 converts the Gaussian beam intensity profile that is typically output by laser 140 into a flat-top profile. An acousto-optic modulator (AO) 144 is used to block the laser beam while SLM 112 is in the process of being loaded with new data, so that the laser beam strikes the SLM only after the micromirrors have settled in their proper orientations to create the current frame image. A beam expander (BE) 146 expands the beam to cover the active area of the SLM.

SLM 112 comprises an array of micromirrors, each of which has two stable orientations (or states): an "on" position in which it reflects the laser radiation toward the desired target (i.e., photocathode 122), and an "off" position in which it reflects the radiation away from the target. The SLM is controlled via interface 110 so that each pixel in the frame image reflected from the SLM has the desired gray level, typically with eight-bit resolution. One method for achieving this result is pulse-width modulation (PWM) of the signal applied to each micromirror. The amount of time in each frame during which the micromirror is in the "on" position is proportional to the length of the pulse. To meet the frame rate objective defined above (10,000 frames/sec), however, with eight-bit gray scale resolution, requires that the shortest control pulse applied to the micromirrors be approximately 0.4 μs long. Currently-available SLM devices are not capable of such high modulation speed. Alternatively, SLM 112 may be controlled in this manner (or using other methods) to produce a smaller number of gray levels.

As another alternative, the intensity of the laser beam may be controlled, using AO modulator 144, for example, so as to emit a number of different intensity levels during each frame. For example, each frame may be divided into eight time slots, during which the laser intensity on SLM 112 is successively set to ⅟₁₂₈, ⅟₆₄, ..., ¼, ½ and full power. Each micromirror is then controlled to be in the "on" position during the appropriate time slot(s) in order to give the desired total gray-scale intensity. This scheme requires that the minimum-length control pulses to the micromirrors be no more than 12.5 μs long. This method, as well, may alternatively be used to produce a smaller or larger number of gray levels. A pulsed laser, synchronized with the SLM control signals, may be used advantageously in this configuration.

Figure 9:
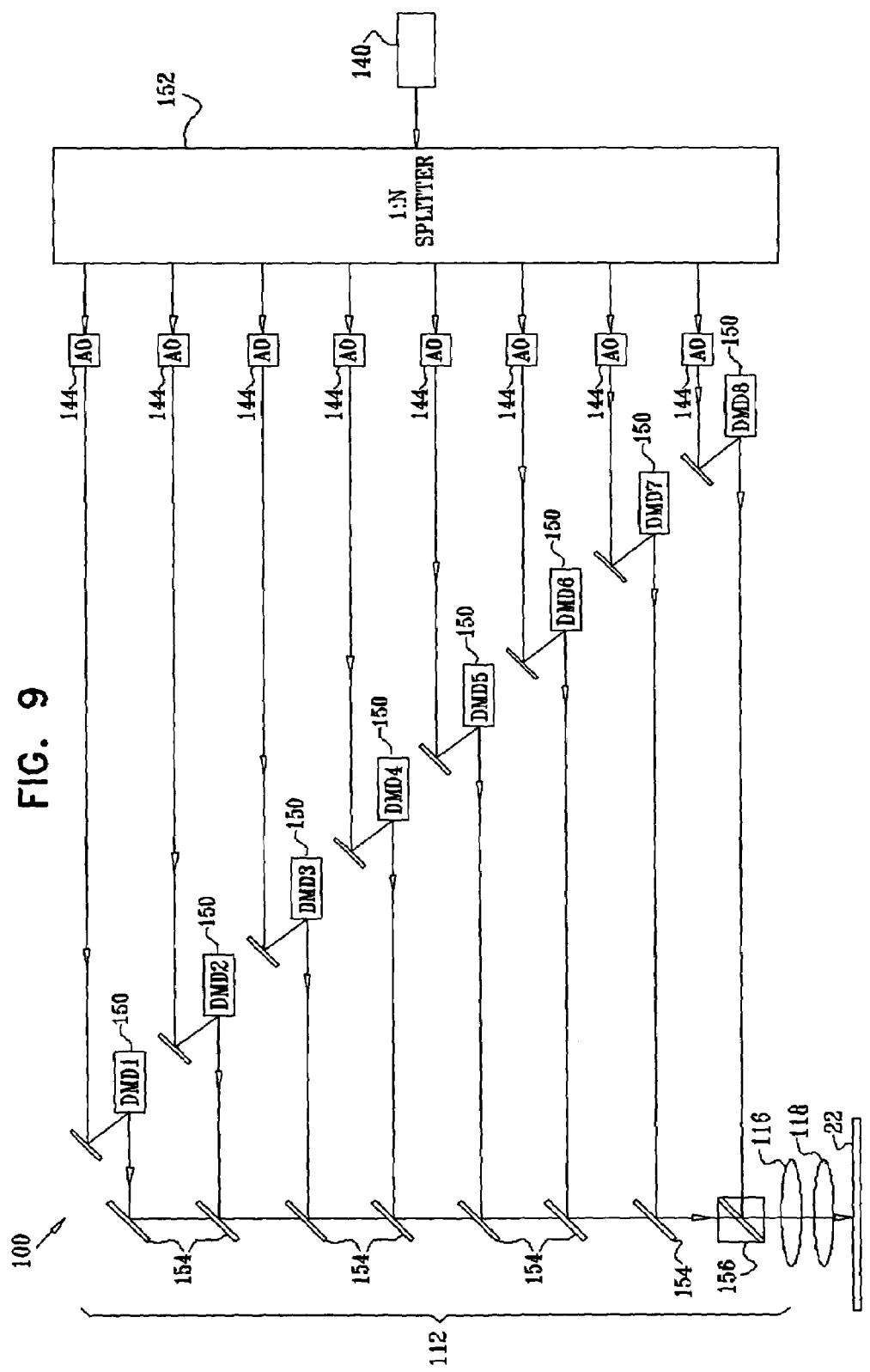
FIG. 9 is a schematic side view of an optics module used in creating a spatially-modulated optical beam, in accordance with another embodiment of the present invention.

FIG. 9 is a schematic side view of optics module 100, in accordance with another embodiment of the present invention. This embodiment is directed to reducing still further the speed requirements involved in controlling SLM 112, which are stringent in comparison to the capabilities of currently-available SLM devices. Therefore, in the embodiment of FIG. 9, SLM 112 is effectively built up from an array of eight binary micromirror devices 150, labeled DMD1 through DMD8, which may operate at substantially slower speeds than the SLM used in the embodiment of FIG. 8. Alternatively, a larger or smaller number of binary spatial modulation devices may be used.

Devices 150 are aligned in mutual registration, so that a given pixel in the frame images created by SLM 112 corresponds to the same micromirror in all of the devices. The beam from laser 140 is split into eight beams of equal intensities by a 1:N splitter 152. Alternatively, a larger or smaller number of beams may be used, and the individual beam intensities may be different. Each beam is switched on and off by its own AO modulator 144 and is then directed toward a respective micromirror device 150. (Intensity converter 142 and beam expander 146 are omitted here for the sake of simplicity.) The optical paths of all the beams are arranged to have equal lengths.

The modulated beams reflected from DMD1 through DMD7 are recombined by an array of 50/50 beamsplitters 154. This arrangement has the effect of attenuating the intensity output of DMD7 by a factor of two, DMD6 by a factor of four, and so forth up to DMD1, which is reduced by a factor of 128. Thus, each of the devices creates a partial frame image, having a different (binary) set of intensity levels. The beams reflected from DMD1 through DMD7 are set to a first polarization, while that from DMD8 has the opposite polarization. Therefore, the combined beam from DMD1 through DMD7 may be merged with the unattenuated output of DMD8 without further loss using a polarization beamsplitter 156. The combination of the partial frame images creates the complete, gray-scale frame image on photocathode 122.

FIG. 10 is a timing diagram that schematically illustrates electrical signals applied to micromirror devices 150, in accordance with an embodiment of the present invention. The gray-scale intensity of each pixel in the frame image on photocathode 122 is controlled by setting the corresponding micromirrors in the appropriate devices 150 to the "on" position, in order to give the desired combination of intensities. For example, an intensity of 96 at a given pixel (on a scale of 0 to 255) in a certain frame would be generated by setting the corresponding micromirrors in DMD 6 and DMD 7 to the "on" position for that frame. The mirrors are set to the desired positions during a setting period 160, and AO modulators 144 then turn on the laser beam to the micromirror devices during an exposure period 162. Note that in this scheme, the micromirrors need be set only once per frame, i.e., once in $T_{FRAME} \cong 100$ μs. Typically, the length of time required to set the mirrors to their new positions for the next frame, $T_S$, is considerably shorter than $T_{FRAME}$. The remainder of the frame period may be used to load the data for the next frame image into devices 150, during the loading time $T_L$.

Combining the beams from the eight DMD channels in the modulator configuration of FIG. 9 may cause undesired intensity variations on photocathode 122 due to interference between the coherent beams. In the embodiment illustrated in FIG. 10, these coherence effects are avoided by time multiplexing of the laser beam, by means of pulses 164 applied to AO modulators 144. In other words, during exposure period 162, the laser beams strike each of devices 150 in succession, so that no more than one channel is active at any given point of time. This temporal offset between the beams prevents interference, but reduces the effective laser power on the photocathode by a factor of eight. Alternatively, a scanner may be used to switch the laser beam among the DMD channels, so that each channel gets the full laser intensity. Further alternatively, other means, as are known in the art, may be used to reduce the coherence of the laser beams optically, so that all eight channels can operate simultaneously without interference effects.

In other embodiments (not shown in the figures), the optical beam may be modulated using a multi-level modulator, as described, for example, in the above-mentioned U.S. Pat. No. 6,399,261. The modulator described in this patent performs multi-level modulation, driven by analog signals. The modulator is susceptible to manufacturing inaccuracies and temperature variations. It is therefore calibrated using an empirical calibration procedure, wherein a series of test patterns are images and analyzed. Micronic Laser Systems AB (Taby, Sweden) has recently presented a prototype of a 1 Mega-pixel analog spatial light modulator.

In yet another embodiment, multiple modulators can be used as described in a U.S patent application entitled, "A Printer and a Method for Recording a Multi-Level Image," filed Jul. 7, 2003, whose disclosure is incorporated herein by reference. Alternatively, light modulation methods described in other publications cited in the Background of the Invention may be used.

Electron Beam Generation Using a Multi-Blanking Array

Figure 11A:
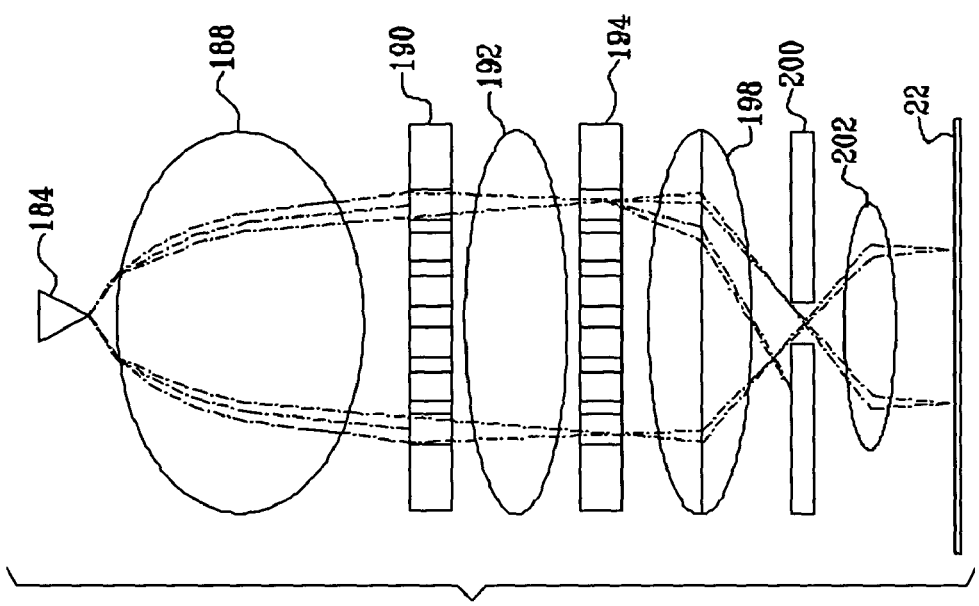
FIG. 11A is a schematic, sectional view of an electron beam module for generating a spatially-modulated electron beam, in accordance with an alternative embodiment of the present invention.
Figure 11B:
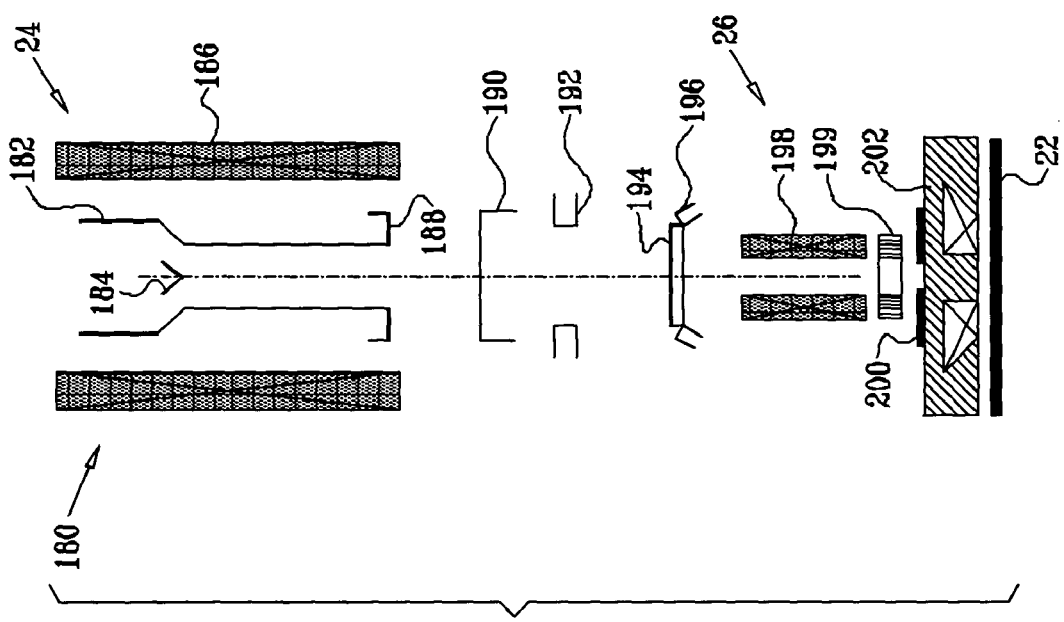
FIG. 11B is a schematic optical diagram illustrating functional aspects of the electron beam module of FIG. 11A.

Reference is now made to FIGS. 11A and 11B, which schematically illustrate an electron beam module 180 for generating a spatially-modulated electron beam, in accordance with an alternative embodiment of the present invention. In this embodiment, e-beam generator 24 creates and modulates the electron beam electronically, rather than by means of optical modulation as in the preceding embodiment. FIG. 11A is a sectional illustration of the e-generator and electron optics in module 180, while FIG. 11B is an equivalent optical diagram.

An electron beam source 182 comprises a cathode 184, which generates a high-intensity electron flux, typically on the order of 1–2 mA/steradian. Cathode 184 may comprise, for example, a thermal field emission (TFE) tip of ZrO/W (zirconium oxide coated with tungsten). Electrons emitted from cathode 184 are accelerated by an electrostatic lens 188, typically through a potential difference of about 30 kV. An illumination lens 186 generates a homogeneous magnetic field along the electron trajectory, in order to irradiate a multi-lens array (MLA) 190 with a slightly-divergent electron beam. MLA 190 comprises multiple electron lenses, which divide the electron beam into multiple beamlets, one per aperture. Typically, MLA 190 comprises about 100×100 apertures, although larger or smaller arrays may similarly be used. An electrostatic field lens 192 accelerates the beamlets following MLA 190 and focuses the beamlets onto a multi-beam blanker 194. Typically, to accelerate the electrons from cathode 184 through blanker 194, the cathode is held at about –50 kV, while lens 188 is held at –20 kV, and blanker 194 is held in a mount 196 at ground potential, i.e., at the potential of wafer 22.

Blanker 194 comprises an array of apertures, each controlled by an electronic shutter element or beam deflector. Each aperture in blanker 194 is aligned to receive the beamlet generated by a corresponding aperture in MLA 190. Typically, the shutter elements are spaced about 100 μm apart and have clear apertures of about 8–10 μm. Miniature electron optics associated with each aperture control the passage of the respective beamlet through the aperture. When a given shutter is open, the beamlet passes through the aperture and continues along the optical path to impinge on wafer 22, as described below. When the shutter is closed, a deflecting field is typically generated in the aperture, which deflects the beamlet away from the open optical path. The length of time for which a particular shutter element is open during the exposure of a given frame controls the number of electrons that flow through the corresponding aperture, and thus determines the gray level of the corresponding pixel in that frame. The electron optics in each aperture, and hence the shutter exposure times, are controlled by PWM signals from controller 28. Alternatively, the shutter elements may simply be set either open or shut, to create a binary electron image.

Various implementations of blanker 194 may be used in module 180. For example, the blanker may be fabricated as a monolithic microelectronic device on a silicon wafer, as shown below in FIGS. 12A and 12B. Alternatively, blanker 194 may be implemented as a micro-electro-mechanical system (MEMS) device coupled to a control chip (or to several control chips, in order to support the desired data rate of 10 Gpixels/sec). Another possible implementation may be based on the system described in the above-mentioned U.S. Pat. No. 6,014,200.

A collimator 198 focuses the electron beamlets, following modulation by blanker 194, through an aperture 200. The aperture blocks beamlets that have been deflected by "closed" shutter elements, as shown in FIG. 11B. A beam deflector deflects the beamlets as a group in the primary and secondary scan directions, in substantially the same manner as deflector 135, described above. An objective 202 focuses and demagnifies the beamlets to form a reduced electron image on wafer 22, with pixel size typically in the range of 25–35 nm. As in the case of optics 26 shown in FIG. 7, the focusing optics are preferably telecentric.

Figure 12A:
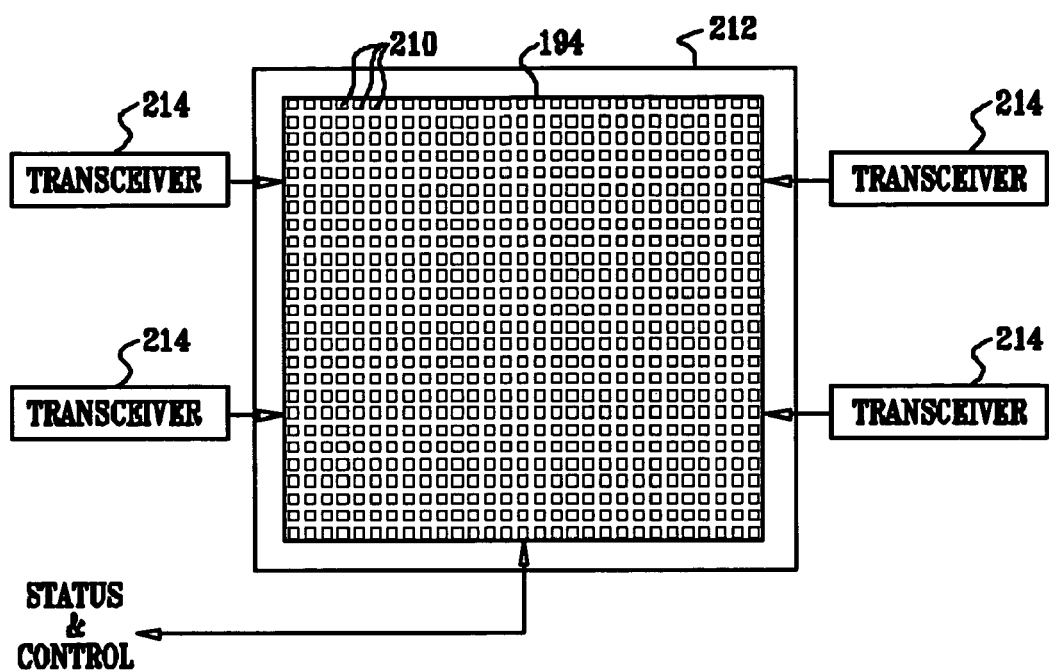
FIG. 12A is a schematic top view of a multi-beam blanker, in accordance with an embodiment of the present invention.
Figure 12B:
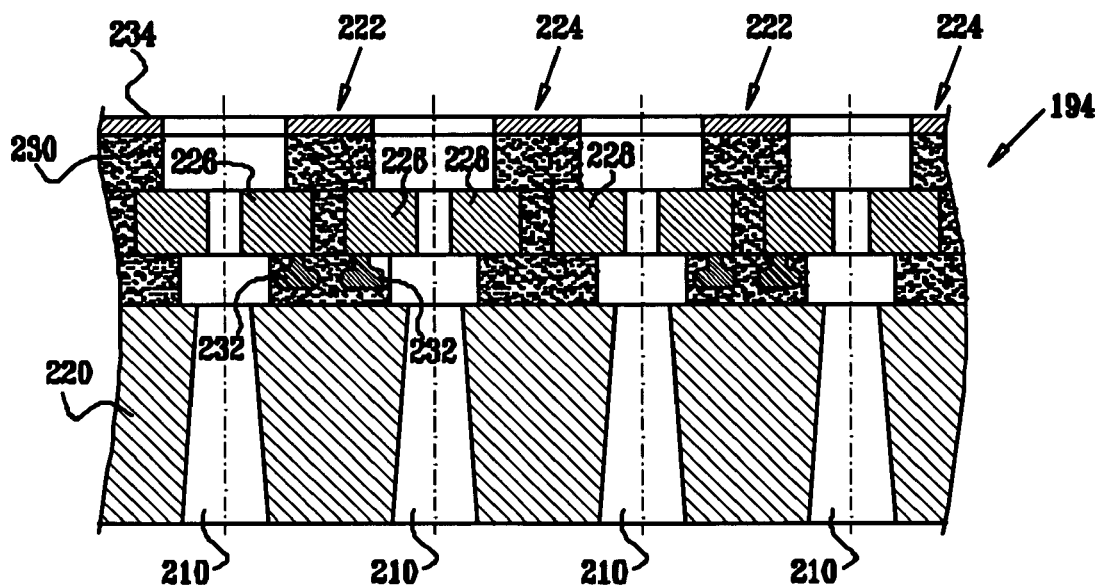
FIG. 12B is a schematic, sectional detail view of a multi-beam blanker, in accordance with an embodiment of the present invention.

FIG. 12A is a schematic top view of blanker 194, in accordance with an embodiment of the present invention. In this embodiment, blanker 194 comprises a silicon chip with apertures 210 passing through the chip, and deflection electrodes associated with each aperture, as shown in FIG. 12B below. Typically, the blanker comprises about 100×100 apertures, spaced about 100 μm apart, as described above. Thus, in this case, the frame images written by system 20 are 100×100 pixels in size (rather than 1000×1000 as in the examples described above). Alternatively, both larger and smaller blanker arrays, with either larger or smaller aperture spacing, may be used. Blanker 194 is contained in a vacuum chamber 212 (which also contains the other electron optics and wafer 22).

Notwithstanding the smaller frame image size, blanker 194 is still capable of operating at a rate of 10 Gpixels/sec, as in the embodiments described above. To meet this speed requirement, four data transceivers 214 may be used, for example, to input control signals to blanker 194, with each transceiver operating at a rate of 2.5 Gpixels/sec. Control and status lines to and from the blanker chip may operate at lower speed.

FIG. 12B is a schematic, sectional view showing a detail of blanker 194, in accordance with an embodiment of the present invention. Apertures 210 are etched through a silicon substrate 220, which is thinned to a thickness of about 100 μm. Metal electrodes 226 and 228 are deposited above a layer 230 of $SiO_2$ on substrate 220. Electrode 226 receives control signals via conductors 232 passing through oxide layer 230, while electrodes 228 are grounded. A ground plane 234 is formed over the upper oxide layer to shield the electronics on the blanker chip.

As can be seen in the figure, a pair of electrodes 226 and 228 bounds each aperture 210. When the control signal carried by conductor 232 to electrode 226 is low (ground), the electron beamlet passes through aperture 210 without deflection. On the other hand, when the control signal is high, an electrostatic potential is created between electrodes 226 and 228, which deflects the beamlet passing through the aperture 210. Aperture 200 blocks the deflected beamlet, which is thus effectively blanked and does not reach wafer 22. As noted above, the length of time for which a given beamlet is deflected during a given frame determines the gray level of the pixel written by that beamlet in the frame.

Although system 20 is described above in the context of creating lithographic patterns on semiconductor wafer 22, the principles of the present invention may similarly be applied in writing high-resolution images on substrates of other sorts. For example, the methods and devices described above may be used, mutatis mutandis, in creating masks and reticles for use in projection lithography, and in patterning flat panel displays and other types of electronic circuits.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art. Although the steps in the method claims in this application may be recited in a certain order, variations on this step ordering are also considered to be within the scope of the present invention.

The invention claimed is:

1. A method for writing a master image on a substrate, comprising:
   dividing the master image into a matrix of frames, each frame comprising an array of pixels defining a respective frame image in a respective frame position within the master image;
   scanning an electron beam in a raster pattern over the substrate; and
   shaping the electron beam responsively to the respective frame image of each of the frames as the electron beam is scanned over the respective frame position on the substrate, so that in each frame, the electron beam simultaneously writes a multiplicity of the pixels onto the substrate wherein each of the pixels has a respective pixel value, and wherein shaping the electron beam comprises writing all the pixels having the same pixel value in the respective frame image substantially simultaneously.

2. The method according to claim 1, wherein writing all the pixels comprises writing all the pixels in the respective frame image substantially simultaneously.

3. The method according to claim 1, wherein shaping the electron beam comprises writing all the pixels in each frame before scanning the electron beam to a successive frame in the raster pattern.

4. The method according to claim 1, wherein shaping the electron beam comprises focusing the electron beam onto the substrate so that at each position in the scan, the focused electron beam covers an area of a single frame.

5. The method according to claim 1, wherein scanning the electron beam comprises:
   mechanically scanning the substrate along a primary scan direction; and
   electrically scanning the electron beam in a secondary scan direction, transverse to the primary scan direction.

6. The method according to claim 5, wherein mechanically scanning the substrate comprises moving the substrate in the primary scan direction substantially continuously, and wherein electrically scanning the electron beam comprises electrically shifting the electron beam in the primary scan direction so as to compensate for motion of the substrate.

7. The method according to claim 5, wherein electrically scanning the electron beam comprises scanning the electron beam in the secondary scan direction in steps corresponding to the frames in a row of the matrix.

8. The method according to claim 1, wherein shaping the electron beam comprises:
   dividing the electron beam into multiple beamlets; and
   selectively blocking the beamlets responsively to the respective frame image of each of the frames.

9. The method according to claim 8, wherein each of the pixels has a respective pixel value, and wherein selectively blocking the beamlets comprises controlling a duration of blocking each of the beamlets responsively to the respective pixel value.

10. The method according to claim 8, wherein selectively blocking the beamlets comprises selectively deflecting the beamlets so that the deflected beamlets do not impinge on the substrate.

11. The method according to claim 10, wherein selectively deflecting the beamlets comprises directing each of the beamlets through a respective aperture among a plurality of apertures in a multi-blanker array, and applying a deflecting field in the respective aperture.

12. The method according to claim 11, wherein the multi-blanker array comprises a semiconductor substrate, through which the apertures are etched, having electrodes formed thereon for applying the deflecting field.

13. The method according to claim 8, wherein scanning the electron beam comprises applying a controlled deflection to the beamlets that are not blocked.

14. The method according to claim 8, wherein shaping the electron beam further comprises focusing the beamlets so as to demagnify the frame image formed by the beamlets that impinge on the substrate.

15. The method according to claim 14, wherein focusing the beamlets comprises forming the frame image on the substrate with a pixel size approximately in the range of 25 to 35 nm.

16. The method according to claim 1, wherein shaping the electron beam comprises:
   modulating a beam of optical radiation responsively to the respective frame image of each of the frames; and
   converting the modulated beam of optical radiation into the shaped electron beam.

17. The method according to claim 16, wherein converting the modulated beam of optical radiation comprises directing the modulated beam of optical radiation to impinge on a photocathode, so that the photocathode emits electrons responsively to the optical radiation, and wherein shaping the electron beam further comprises accelerating the electrons emitted by the photocathode toward the substrate.

18. The method according to claim 17, wherein scanning the electron beam comprises applying a controlled deflection to the accelerated electrons.

19. The method according to claim 17, wherein the photocathode is contained in an evacuated enclosure, and wherein accelerating the electrons comprises causing the electrons to exit from the enclosure through a membrane.

20. The method according to claim 17, wherein directing the modulated beam of optical radiation comprises focusing the modulated beam of optical radiation so as to form a demagnified image on the cathode, and wherein accelerating the electrons comprises focusing the electrons that impinge on the substrate so as to further demagnify the demagnified image.

21. The method according to claim 20, wherein modulating the beam of optical radiation comprises creating an optical image having a first pixel size, and wherein focusing the electrons that impinge on the substrate comprises forming an electron image having a second pixel size that is less than about $1/100$ of the first pixel size.

22. The method according to claim 21, wherein the second pixel size is less than about $1/400$ of the first pixel size.

23. The method according to claim 20, wherein focusing the electrons that impinge on the substrate comprises forming an electron image having a pixel size approximately in the range of 25 to 35 nm.

24. The method according to claim 16, wherein modulating the beam of optical radiation comprises directing the beam of optical radiation to impinge on spatial light modulator (SLM) comprising at least one array of micromirrors, and controlling respective orientations of the micromirrors responsively to the respective frame image.

25. The method according to claim 24, wherein each of the micromirrors corresponds to a pixel in the respective frame image and has an "on" position and an "off" position, and wherein controlling the respective orientations comprises setting a respective time during which each of the micromirrors is to be in the "on" position responsively to the corresponding pixel in the respective frame image.

26. The method according to claim 25, wherein setting the respective time comprises controlling a length of time during which each of the micromirrors is to be in the "on" position responsively to a gray-scale pixel value of the corresponding pixel.

27. The method according to claim 25, wherein directing the beam of optical radiation comprises varying an intensity of the beam of optical radiation so that the intensity has different values in a plurality of different time slots, and wherein setting the respective time comprises selecting the time slots during which each of the micromirrors is to he in the "on" position responsively to a gray-scale pixel value of the corresponding pixel.

28. The method according to claim 24, wherein the at least one array of micromirrors comprises a plurality of arrays of micromirrors, which are aligned in mutual registration such that each of the micromirrors in each of the arrays corresponds to a pixel in the respective frame image and has an "on" position and an "off" position, and wherein directing the beam of optical radiation comprises directing at least a portion of the beam of optical radiation to impinge on each of the plurality of the arrays so that the arrays of micromirrors create respective partial frame images having respective sets of intensity levels, and combining the partial frame images to produce the frame image.

29. The method according to claim 28, wherein directing at least the portion of the beam of optical radiation comprises directing at least the portion of the beam to impinge on the arrays in succession, so that the partial frame images are created sequentially and not simultaneously.

30. The method according to claim 1, wherein dividing the master image comprises arranging the frames so that each frame comprises an overlap region in which the frame overlaps one or more other frames adjacent thereto in the matrix, and modifying the frame images in the overlap region so as to avoid discontinuities in features written on the substrate due to imperfect registration between the frames.

31. The method according to claim 30, wherein modifying the frame images comprises:
identifying a feature of the master image in the overlap region between first and second frames in the matrix;
if the feature extends outside the overlap region into the first frame but not into the second frame, assigning the feature to be written in the first frame but not in the second frame; and
if the feature extends outside the overlap region into both the first and second frames, assigning the feature to be written in both the first and second frames while blending a portion of the feature in the overlap region.

32. The method according to claim 1, wherein shaping the electron beam comprises:
shaping the electron beam responsively to a known reference pattern, so as to write a reference image on the substrate;
comparing the reference image to the reference pattern so as to map a distortion of the pattern; and
modifying the respective frame image responsively to the mapped distortion, thereby reducing the distortion in the frame image.

33. The method according to claim 1, wherein the substrate comprises a semiconductor wafer, and the master image comprises a circuit pattern, and wherein scanning and shaping the electron beam comprises writing the circuit pattern on the wafer.

34. Apparatus for writing a master image on a substrate, comprising:
a controller, which is adapted to divide the master image into a matrix of frames, each frame comprising an array of pixels defining a respective frame image in a respective frame position within the master image;
a translation device, which is adapted to cause an electron beam to scan over the substrate in a primary scan direction;
electron optics, which are adapted to scan the electron beam in a secondary scan direction, transverse to the primary scan direction, so that the electron beam is scanned in a raster pattern over the substrate; and
an electron beam generator, which is adapted to generate and shape the electron beam responsively to the respective frame image of each of the frames as the electron beam is scanned over the respective frame position on the substrate, so that in each frame, the electron beam simultaneously writes a multiplicity of the pixels onto the substrate wherein each of the pixels has a respective pixel value, and wherein the electron beam generator is adapted to write all the pixels having the same pixel value in the respective frame image substantially simultaneously.

35. The apparatus according to claim 34, wherein the electron beam generator is adapted to write all the pixels in the respective frame image substantially simultaneously.

36. The apparatus according to claim 34, wherein the electron beam generator is adapted to write all the pixels in each frame before the electron optics scan the electron beam to a successive frame in the raster pattern.

37. The apparatus according to claim 34, wherein the electron optics are adapted to focus the electron beam onto the substrate so that at each position in the scan, the focused electron beam covers an area of a single frame.

38. The apparatus according to claim 34, wherein the translation device comprises a translation stage, which is adapted to translate the substrate along the primary scan direction.

39. The apparatus according to claim 38, wherein the translation stage is adapted to move the substrate in the primary scan direction substantially continuously, and wherein the electron optics are adapted to electrically deflect the electron beam in the primary scan direction so as to compensate for motion of the substrate.

40. The apparatus according to claim 38, wherein the electron optics are adapted to scan the electron beam in the secondary scan direction in steps corresponding to the frames in a row of the matrix.

41. The apparatus according to claim 34, wherein the electron beam generator comprises:
- a multi-lens array, which is adapted to divide the electron beam into multiple beamlets; and
- a multi-beam blanker, which is aligned to selectively block the beamlets responsively to the respective frame image of each of the frames.

42. The apparatus according to claim 41, wherein each of the pixels has a respective pixel value, and wherein the multi-beam blanker is adapted to control a duration of blocking each of the beamlets responsively to the respective pixel value.

43. The apparatus according to claim 41, wherein the multi-beam blanker is adapted to selectively deflect the beamlets so that the deflected beamlets do not impinge on the substrate.

44. The apparatus according to claim 43, wherein the multi-beam blanker comprises:
- a plurality of apertures, which are aligned so that each of the beamlets passes through a respective aperture among the plurality of apertures; and
- electrodes, which are respectively associated with each of the apertures, and are coupled to apply a deflecting field in the respective aperture.

45. The apparatus according to claim 43, wherein the multi-blanker array comprises a semiconductor substrate, through which the apertures are etched, and on which the electrodes are formed in proximity to the respective apertures.

46. The apparatus according to claim 41, wherein the electron optics are adapted to scan the electron beam by applying a controlled deflection to the beamlets that are not blocked.

47. The apparatus according to claim 41, wherein the electron optics comprise an objective, which is adapted to focus the beamlets so as to demagnify the frame image formed by the beamlets that impinge on the substrate.

48. The apparatus according to claim 47, wherein the objective is adapted to focus the frame image on the substrate to a pixel size approximately in the range of 25 to 35 nm.

49. The apparatus according to claim 34, wherein the electron beam generator comprises:
- an optics module, which is adapted to modulate a beam of optical radiation responsively to the respective frame image of each of the frames; and
- a photocathode, on which the modulated beam of optical radiation is incident, and which is adapted to emit electrons responsively to the optical radiation, so as to generate and shape the electron beam.

50. The apparatus according to claim 49, wherein the electron optics are adapted to accelerate the electrons emitted by the photocathode toward the substrate.

51. The apparatus according to claim 50, wherein the electron optics are adapted to scan the electron beam by applying a controlled deflection to the accelerated electrons.

52. The apparatus according to claim 50, and comprising an evacuated enclosure containing the photocathode, the enclosure comprising an optical window adapted for passage of the optical radiation therethrough and a membrane adapted for passage of the electron beam therethrough.

53. The apparatus according to claim 49, wherein the optics module comprises an optical objective, which is adapted to focus the modulated beam of optical radiation so as to form a demagnified image on the cathode, and wherein the electron optics comprise an electron objective, which is adapted to focus the electrons that impinge on the substrate so as to further demagnify the demagnified image.

54. The apparatus according to claim 53, wherein the objective is adapted to form an optical image having a first pixel size, and wherein the electron objective is adapted to form an electron image having a second pixel size that is less than about $1/100$ of the first pixel size.

55. The apparatus according to claim 54, wherein the second pixel size is less than about $1/400$ of the first pixel size.

56. The apparatus according to claim 53, wherein the electron optics comprise an electron objective, which is adapted to focus the electrons that impinge on the substrate so as to form an electron image having a pixel size approximately in the range of 25 to 35 nm.

57. The apparatus according to claim 49, wherein the optics module comprises a spatial light modulator (SLM) comprising at least one array of micromirrors, on which the beam of optical radiation is incident, and wherein the controller is coupled to cause the SLM to modulate the beam of optical radiation by controlling respective orientations of the micromirrors responsively to the respective frame image.

58. The apparatus according to claim 57, wherein each of the micromirrors corresponds to a pixel in the respective frame image and has an "on" position and an "off" position, and wherein the controller is adapted to set a respective time during which each of the micromirrors is to be in the "on" position responsively to the corresponding pixel in the respective frame image.

59. The apparatus according to claim 58, wherein the controller is adapted to control a length of time during which each of the micromirrors is to be in the "on" position responsively to a gray-scale pixel value of the corresponding pixel.

60. The apparatus according to claim 58, wherein the optics module comprises a beam source, which is adapted to generate the beam of optical radiation while varying an intensity of the optical radiation so that the intensity has different values in a plurality of different time slots, and wherein the controller is adapted to select the time slots during which each of the micromirrors is to be in the "on" position responsively to a gray-scale pixel value of the corresponding pixel.

61. The apparatus according to claim 57, wherein the at least one array of micromirrors comprises a plurality of arrays of micromirrors, which are aligned in mutual registration such that each of the micromirrors in each of the arrays corresponds to a pixel in the respective frame image and has an "on" position and an "off" position, and
wherein the optics module is adapted to direct at least a portion of the beam of optical radiation to impinge on each of the plurality of the arrays so that the arrays of micromirrors create respective partial frame images having respective sets of intensity levels, and comprises a beam combiner, which is adapted to combine the partial frame images to produce the frame image.

62. The apparatus according to claim 61, wherein the optics module is adapted to direct at least the portion of the beam of optical radiation to impinge on the arrays in succession, so that the partial frame images are created sequentially and not simultaneously.

63. The apparatus according to claim 34, wherein the controller is adapted to divide the master image into the frames so that each frame comprises an overlap region in which the frame overlaps one or more other frames adjacent thereto in the matrix, and wherein the controller is adapted to modify the frame images in the overlap region so as to avoid discontinuities in features written on the substrate due to imperfect registration between the frames.

64. The apparatus according to claim 63, wherein the controller is adapted to identify a feature of the master image in the overlap region between first and second frames in the matrix, and to modify the frame images of the first and second frames so that if the feature extends outside the overlap region into the first frame but not into the second frame, the feature is assigned to be written in the first frame but not in the second frame, whereas if the feature extends outside the overlap region into both the first and second frames, the feature is assigned to be written in both the first and second frames while blending a portion of the feature in the overlap region.

65. The apparatus according to claim 34, wherein the controller is adapted to modify the respective frame image of each of the frames responsively to a map of distortion created by shaping the electron beam responsively to a known reference pattern, so as to write a reference image on the substrate, and comparing the reference image to the reference pattern so as to map the distortion of the pattern.

66. The apparatus according to claim 34, wherein the substrate comprises a semiconductor wafer, and the master image comprises a circuit pattern, which is written by shaping and scanning the electron beam.

* * * * *